US006954166B2

(12) United States Patent
Kasai

(10) Patent No.: US 6,954,166 B2
(45) Date of Patent: Oct. 11, 2005

(54) CURRENT GENERATING CIRCUIT, ELECTRO-OPTICAL DEVICE, AND ELECTRONIC APPARATUS

(75) Inventor: Toshiyuki Kasai, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/921,221

(22) Filed: Aug. 19, 2004

(65) Prior Publication Data

US 2005/0099328 A1 May 12, 2005

(30) Foreign Application Priority Data

Nov. 6, 2003 (JP) ....................................... 2003-377172

(51) Int. Cl.[7] ................................................. H03M 1/66
(52) U.S. Cl. ........................................ 341/144; 341/150
(58) Field of Search ................................. 341/155, 144, 341/135, 153, 150; 345/204, 212; 315/169.11, 169.3

(56) References Cited

U.S. PATENT DOCUMENTS 6,067,037 A * 5/2000 Kato .......................... 341/150
6,498,438 B1 * 12/2002 Edwards .................. 315/169.3
6,765,560 B1 * 7/2004 Ozawa ....................... 345/204
2003/0227262 A1 * 12/2003 Kwon ..................... 315/169.3

* cited by examiner

*Primary Examiner*—Peguy JeanPierre
(74) *Attorney, Agent, or Firm*—Oliff & Berridge PLC

(57) ABSTRACT

To provide a current generating circuit capable of generating an analog current having non-linear characteristic from linearly-instructed grayscale data with a small number of elements and a simple circuit structure, and an electro-optical device and an electronic apparatus employing the current generating circuit. A digital-to-analog conversion circuit section 25 can perform time-sharing processing by selectively turning on and off first to third selection signals S1 to S3. In the first processing, electric charges corresponding to a first output current obtained by binary-weighting a reference current corresponding to a reference voltage Vref is stored in a storage capacitor Ch. In the second processing, by inputting a second output voltage Vout2 corresponding to the electric charges stored in the storage capacitor Ch to the respective gates of the first to fourth driving transistors Qd1 to Qd4, the digital-to-analog conversion is further performed using the first output current as the reference current. Therefore, it is possible to obtain an analog current output by raising the input image digital data D1 to D4 to the second power.

25 Claims, 15 Drawing Sheets

CURRENT GENERATING CIRCUIT, ELECTRO-OPTICAL DEVICE, AND ELECTRONIC APPARATUS

BACKGROUND OF THE INVENTION

1. Field of Invention

The present invention relates to a current generating circuit, an electro-optical device, and an electronic apparatus.

2. Description of Related Art

Digital-to-analog conversion circuits (DAC) for converting digital signals into analog signals are widely used in various electronic apparatuses. For example, as the DACs used for electro-optical display devices such as organic electroluminescent display devices, current DACs for converting digital signals (grayscale data) into analog current values and supplying the analog current values to pixel circuits are used. In this type of the current DAC, by constituting a current mirror in which the β ratio of transistors of which the gates are commonly connected is binary-weighted and adding currents flowing through the respective transistors, the analog signals (analog current) are obtained from the digital signals.

SUMMARY OF THE INVENTION

It may be necessary to obtain non-linear analog signals (current) from digital signals according to usage. For example, in the electro-optical devices, signal processing called γ (gamma) correction is performed. The γ correction is signal processing in which the non-linear (for example, exponential, algebraic) analog current is output from linearly instructed grayscale data, so that the brightness displayed with the grayscale in accordance with the linearly instructed grayscale data (digital signals) is naturally seen with human naked eyes.

However, since the current DAC is a linear DAC, the current DAC could not generate the non-linear analog current from the linearly instructed grayscale data. Therefore, in order to generate the non-linear analog current from the grayscale data, for example, a signal processing circuit for performing the γ correction is used. The signal processing circuit requires a large number of circuit elements and is a complex circuit, thereby enlarging the circuit size. As a result, it is very disadvantageous for the electro-optical devices requiring miniaturization and cost reduction.

The present invention is contrived to solve the above problems and it is an object of the present invention to provide a current generating circuit capable of generating a non-linear analog current from linearly instructed grayscale data with a small number of elements and a simple circuit structure, and an electro-optical device and an electronic apparatus employing the current generating circuit.

In order to accomplish the above object, a current generating circuit according to the present invention comprises: a current adding circuit for generating a plurality of elementary currents on the basis of a first control signal or a second control signal and then generating a resultant current by adding selected elementary currents from the plurality of elementary currents on the basis of digital input signals; a first signal generating circuit for generating the first control signal; a second signal generating circuit for generating the second control signal; a first selection circuit for selecting either the first control signal or the second control signal and supplying the selected control signal to the current adding circuit; and a second selection circuit for supplying the resultant current of the current adding circuit to either the second signal generating circuit or an external circuit.

According to the present invention, the first selection circuit selects either the first control signal generated by the first signal generating circuit or the second control signal generated by the second signal generating circuit. Then, the current adding circuit supplies the output current proportional to the input digital input signals to either the second signal generating circuit or the external circuit selected by the second selection circuit, on the basis of the selected control signal. As a result, the current generating circuit can perform time-sharing processing, so that it is possible to generate an analog current having a non-linear characteristic from the linearly instructed grayscale data with a small number of elements and a simple circuit structure, without providing a complex signal processing circuit or a plurality of digital-to-analog conversion circuits. Therefore, it is possible to make the whole device small and to reduce the cost thereof.

The current generating circuit according to the present invention may perform the selection on the basis of a selection signal from a selection control circuit for controlling the first and second selection circuits, wherein, when the first selection circuit selects the first control signal, the second selection circuit supplies from the current adding circuit to the second signal generating circuit the resultant current obtained by selecting and adding the elementary currents generated on the basis of the first control signal in accordance with the digital input signals, and stores the resultant current as the second control signal, and wherein, when the first selection circuit selects the second control signal, the second selection circuit supplies from the current adding circuit to the external circuit the resultant current obtained by selecting and adding the elementary currents generated on the basis of the second control signal in accordance with the digital input signals, as an output signal.

According to the present invention, the current generating circuit performs the selection on the basis of the selection signal from the selection control circuit for controlling the first and second selection circuits. When the first selection circuit selects the first control signal, the second selection circuit supplies from the current adding circuit to the second signal generating circuit the resultant current obtained by selecting and adding the elementary currents generated in accordance with the first control signal on the basis of the digital input signals, and stores the resultant current as the second control signal. When the first selection circuit selects the second control signal, the second selection circuit supplies from the current adding circuit to the external circuit the resultant current obtained by selecting and adding the elementary currents generated in accordance with the second control signal on the basis of the digital input signals, as an output signal. As a result, the current generating circuit can perform the time-sharing processing. That is, the output of the current adding circuit in the first processing is stored as the second control signal. In the second processing, the elementary currents are generated in accordance with the second control signal and the resultant current selected and added on the basis of the digital input signals, similar to the first processing, is supplied as the output signal of the current adding circuit to the external circuit. As a result, it is possible to generate an analog current having a non-linear characteristic from the linearly instructed grayscale data with a small number of elements and a simple circuit structure, without providing a complex signal processing circuit or a plurality of digital-to-analog conversion circuits.

Therefore, it is possible to make the whole device small and to reduce the cost thereof.

In the current generating circuit according to the present invention, the current values of the plurality of elementary currents generated from the current adding circuit may have a binary-weighted relation.

According to the present invention, by weighting the elementary currents generated by the current adding circuit corresponding to each bit of the digital input signals, the current adding circuit can provide a non-linear analog current output with a small number of element and a simple circuit structure. Therefore, it is possible to make the whole circuit small and to reduce the cost thereof.

In the current generating circuit according to the present invention, the current adding circuit may be a digital-to-analog conversion circuit section, wherein the digital-to-analog conversion circuit section comprises: a plurality of first transistors having different gains, each first transistor comprising a first control terminal to which the first control signal or the second control signal is input through the first selection circuit, and generating the corresponding one of the plurality of elementary currents; a plurality of second transistors connected in series to the plurality of first transistors, respectively, each second transistor comprising a second control terminal to which the corresponding digital input signals are input; and a current path for adding the elementary currents output from the corresponding first transistors on the basis of turn-on operation of the plurality of second transistors according to the digital input signals and supplying the added elementary currents as the resultant current to the second selection circuit.

According to the present invention, either the first control signal or the second control signal is supplied to the plurality of first transistors through the first selection circuit. The elementary currents output from the corresponding first transistors are added on the basis of turn-on operation of the plurality of second transistors, which are connected in series to the plurality of first transistors, according to the digital input signals, and the added elementary currents are supplied as the resultant current to the second selection circuit. As a result, the linear analog current output can be obtained with a simple structure. Therefore, it is possible to make the whole circuit small and to reduce the cost thereof.

In the current generating circuit according to the present invention, the gain coefficients of the plurality of first transistors may be set to binary-weighted values, respectively.

According to this invention, by weighting the gain coefficients of the plurality of first transistors corresponding to the respective bits of the first control signal, the current generating circuit can accomplish the linear analog current output with a small number of elements and a simple structure. Therefore, it is possible to make the whole circuit small and to reduce the cost thereof.

In the current generating circuit according to the present invention, the first transistors may include a parallel-connected structure of transistors having predetermined gains.

According to this invention, by connecting the transistors having predetermined gains in parallel to form the first transistors, the current generating circuit can accurately accomplish the linear analog current output with a small number of circuit elements and a simple circuit structure.

In the current generating circuit according to the present invention, the first transistors may include a serial-connected structure of transistors having predetermined gains.

According to this invention, by connecting the transistors having predetermined gains in series to form the first transistors, the current generating circuit can accurately accomplish the linear analog current output with a small number of circuit elements and a simple circuit structure.

In the current generating circuit according to the present invention, the current adding circuit may comprise an adjusting circuit for generating a second elementary current having a predetermined ratio with respect to the second control signal from the second signal generating circuit and adding the second elementary current to the resultant current, when the first selection circuit selects the second control signal.

According to this invention, by adding the second elementary current having a predetermined ratio with respect to the second control signal from the second signal generating circuit and adding the second elementary current to the resultant current when the first selection circuit selects the second control signal, the current generating circuit can realize the analog current output having a wide non-linearity. As a result, it is possible to generate the analog current output having a wide non-linearity from the digital input signals with a small number of elements and a simple circuit structure, without providing a complex signal processing circuit or a plurality of current generating circuits. Therefore, it is possible to make the whole circuit small and to reduce the cost thereof.

In the current generating circuit according to the present invention, the second signal generating circuit may comprise storage means for storing a signal corresponding to the resultant current generated by the current adding circuit as the second control signal.

According to this invention, the resultant current from the current adding circuit is stored as the second control signal in the storage means. For this reason, by storing the signal, which corresponds to the resultant current from the current adding circuit when the first control signal is input, as the second control signal and applying the voltage obtained from the storage means to the current adding circuit, it is possible to perform the time-sharing processing with a small number of circuit elements and a simple circuit structure. Therefore, it is possible to make the whole circuit small and to reduce the cost thereof.

In the current generating circuit according to the present invention, the second signal generating circuit may comprise current to voltage conversion means for converting a current corresponding to the resultant current generated by the current adding circuit into a voltage.

According to this invention, the second signal generating circuit can convert the current, which corresponds to the resultant current generated by the current adding circuit, into a voltage using the current-voltage conversion means.

In the current generating circuit according to the present invention, the second signal generating circuit may have a function of storing the voltage generated by the current-voltage conversion means in the storage means.

According to this invention, the voltage generated by the current to voltage conversion means is stored in the storage means. For this reason, by converting the resultant current from the current adding circuit when the first control signal is input into the voltage, storing the voltage, and applying the voltage, which is obtained from the storage means, as the second control signal to the current adding circuit, it is possible to perform the time-sharing processing with a small number of circuit elements and a simple circuit structure. Therefore, it is possible to make the whole circuit small and to reduce the cost thereof.

An electro-optical device according to the present invention comprises: a plurality of scanning lines, a plurality of data lines, and pixel portions having electro-optical elements provided corresponding to intersections of the plurality of scanning lines and the plurality of data lines, a scanning line driving circuit for scanning the plurality of scanning lines, and a data line driving circuit for supplying an analog current to the corresponding pixel portions through the plurality of data lines, wherein the data line driving circuit comprises: a current adding circuit for generating a plurality of elementary currents on the basis of a first control signal or a second control signal and then generating a resultant current by adding selected elementary currents from the plurality of elementary currents on the basis of digital input signals; a first signal generating circuit for generating the first control signal; a second signal generating circuit for generating the second control signal; a first selection circuit for selecting either the first control signal or the second control signal and supplying the selected control signal to the current adding circuit; and a second selection circuit for supplying the resultant current of the current adding circuit to either the second signal generating circuit or an external circuit.

According to the present invention, the first selection circuit selects either the first control signal generated by the first signal generating circuit or the second control signal generated by the second signal generating circuit. Then, the current adding circuit supplies the output current proportional to the input digital input signals to either the second signal generating circuit or the external circuit selected by the second selection circuit, on the basis of the selected control signal. As a result, the electro-optical device can perform time-sharing processing, so that it is possible to generate an analog current having a non-linear characteristic from the linearly instructed grayscale data with a small number of elements and a simple circuit structure, without providing a complex signal processing circuit or a plurality of digital-to-analog conversion circuits. Therefore, it is possible to make the whole device small and to reduce the cost thereof.

In the electro-optical device according to the present invention, the data line driving circuit may perform the selection on the basis of a selection signal from a selection control circuit for controlling the first and second selection circuits, wherein, when the first selection circuit selects the first control signal, the second selection circuit supplies from the current adding circuit to the second signal generating circuit the resultant current obtained by selecting and adding the elementary currents generated on the basis of the first control signal in accordance with the digital input signals, and stores the resultant current as the second control signal, and wherein, when the first selection circuit selects the second control signal, the second selection circuit supplies from the current adding circuit to the external circuit the resultant current obtained by selecting and adding the elementary currents generated on the basis of the second control signal in accordance with the digital input signals, as an output signal.

According to the present invention, the electro-optical device performs the selection on the basis of the selection signal from the selection control circuit for controlling the first and second selection circuits. When the first selection circuit selects the first control signal, the second selection circuit supplies from the current adding circuit to the second signal generating circuit the resultant current obtained by selecting and adding the elementary currents generated in accordance with the first control signal on the basis of the digital input signals, and stores the resultant current as the second control signal. When the first selection circuit selects the second control signal, the second selection circuit supplies from the current adding circuit to the external circuit the resultant current obtained by selecting and adding the elementary currents generated in accordance with the second control signal on the basis of the digital input signals, as an output signal. As a result, the electro-optical device can perform the time-sharing processing. That is, the output of the current adding circuit in the first processing is stored as the second control signal. In the second processing, the elementary currents are generated in accordance with the second control signal and the resultant current selected and added on the basis of the digital input signals, similar to the first processing, is supplied as the output signal of the current adding circuit to the external circuit. As a result, it is possible to generate an analog current having a non-linear characteristic from the linearly instructed grayscale data with a small number of elements and a simple circuit structure, without providing a complex signal processing circuit or a plurality of digital-to-analog conversion circuits. Therefore, it is possible to make the whole device small and to reduce the cost thereof.

In the electro-optical device according to the present invention, the current values of the plurality of elementary currents generated from the current adding circuit may have a binary-weighted relation.

According to the present invention, by weighting the elementary currents generated by the current adding circuit corresponding to each bit of the digital input signals, the current adding circuit can provide a non-linear analog current output with a small number of element and a simple circuit structure. Therefore, it is possible to make the whole device small and to reduce the cost thereof.

In the electro-optical device according to the present invention, the current adding circuit may be a digital-to-analog conversion circuit section, and the digital-to-analog conversion circuit section may comprise: a plurality of first transistors having different gains, each first transistor comprising a first control terminal to which the first control signal or the second control signal is input through the first selection circuit, and generating the corresponding one of the plurality of elementary currents; a plurality of second transistors connected in series to the plurality of first transistors, respectively, each second transistor comprising a second control terminal to which the corresponding digital input signals are input; and a current path for adding the elementary currents output from the corresponding first transistors on the basis of turn-on operation of the plurality of second transistors according to the digital input signals and supplying the added elementary currents as the resultant current to the second selection circuit.

According to the present invention, either the first control signal or the second control signal is supplied to the plurality of first transistors through the first selection circuit. The elementary currents output from the corresponding first transistors are added on the basis of turn-on operation of the plurality of second transistors, which are connected in series to the plurality of first transistors, according to the digital input signals, and the added elementary currents are supplied as the resultant current to the second selection circuit. As a result, the linear analog current output can be obtained with a simple structure. Therefore, it is possible to make the whole device small and to reduce the cost thereof.

In the electro-optical device according to the present invention, the gain coefficients of the plurality of first transistors may be set to binary-weighted values, respectively.

According to this invention, by weighting the gain coefficients of the plurality of first transistors corresponding to the respective bits of the first control signal, the current generating circuit can accomplish the linear analog current output with a small number of elements and a simple structure. Therefore, it is possible to make the whole device small and to reduce the cost thereof.

In the electro-optical device according to the present invention, the first transistors may include a parallel-connected structure of transistors having predetermined gains.

According to this invention, by connecting the transistors having predetermined gains in parallel to form the first transistors, the electro-optical device can accurately accomplish the linear analog current output with a small number of circuit elements and a simple circuit structure.

In the electro-optical device according to the present invention, the first transistors may include a serial-connected structure of transistors having predetermined gains.

According to this invention, by connecting the transistors having predetermined gains in series to form the first transistors, the electro-optical device can accurately accomplish the linear analog current output with a small number of circuit elements and a simple circuit structure.

In the electro-optical device according to the present invention, the current adding circuit may comprise an adjusting circuit for generating a second elementary current having a predetermined ratio with respect to the second control signal from the second signal generating circuit and adding the second elementary current to the resultant current, when the first selection circuit selects the second control signal.

According to this invention, by adding the second elementary current having a predetermined ratio with respect to the second control signal from the second signal generating circuit and adding the second elementary current to the resultant current when the first selection circuit selects the second control signal, the electro-optical device can realize the analog current output having a wide non-linearity. As a result, it is possible to generate the analog current output having a wide non-linearity from the digital input signals with a small number of elements and a simple circuit structure, without providing a complex signal processing circuit or a plurality of current generating circuits. Therefore, it is possible to make the whole device small and to reduce the cost thereof.

In the electro-optical device according to the present invention, the second signal generating circuit may comprise storage means for storing a signal corresponding to the resultant current generated by the current adding circuit as the second control signal.

According to this invention, the resultant current from the current adding circuit is stored as the second control signal in the storage means. For this reason, by storing the signal, which corresponds to the resultant current from the current adding circuit when the first control signal is input, as the second control signal and applying the voltage obtained from the storage means to the current adding circuit, it is possible to perform the time-sharing processing with a small number of circuit elements and a simple circuit structure. Therefore, it is possible to make the whole device small and to reduce the cost thereof.

In the electro-optical device according to the present invention, the second signal generating circuit may comprise current to voltage conversion means for converting a current corresponding to the resultant current generated by the current adding circuit into a voltage.

According to this invention, the second signal generating circuit can convert the current, which corresponds to the resultant current generated by the current adding circuit, into a voltage using the current-voltage conversion means.

In the electro-optical device according to the present invention, the second signal generating circuit may have a function of storing the voltage generated by the current-voltage conversion means in the storage means.

According to this invention, the voltage generated by the current to voltage conversion means is stored in the storage means. For this reason, by converting the resultant current from the current adding circuit when the first control signal is input into the voltage, storing the voltage, and applying the voltage, which is obtained from the storage means, as the second control signal to the current adding circuit, it is possible to perform the time-sharing processing with a small number of circuit elements and a simple circuit structure. Therefore, it is possible to make the whole device small and to reduce the cost thereof.

In the electro-optical device according to the present invention, the electro-optical elements are organic electroluminescent elements.

According to this invention, the electro-optical device of which the electro-optical elements are the organic electroluminescent elements can accomplish the non-linear analog current output from the digital input signals with a small number of elements and a simple circuit structure, without providing a complex signal processing circuit or a plurality of current generating circuits.

An electronic apparatus according to the present invention comprises the aforementioned current generating circuit.

According to the present invention, it is possible to obtain the non-linear analog current output from the digital input signals with a small number of elements and a simple circuit structure, without providing a complex signal processing circuit or a plurality of current generating circuits.

An electronic apparatus according to the present invention comprises the aforementioned electro-optical device.

According to the present invention, it is possible to obtain the non-linear analog current output from the digital input signals with a small number of elements and a simple circuit structure, without providing a complex signal processing circuit or a plurality of current generating circuits.

DETAILED DESCRIPTION OF PREFERRED EMBODIMENTS

First Embodiment

Figure 1:
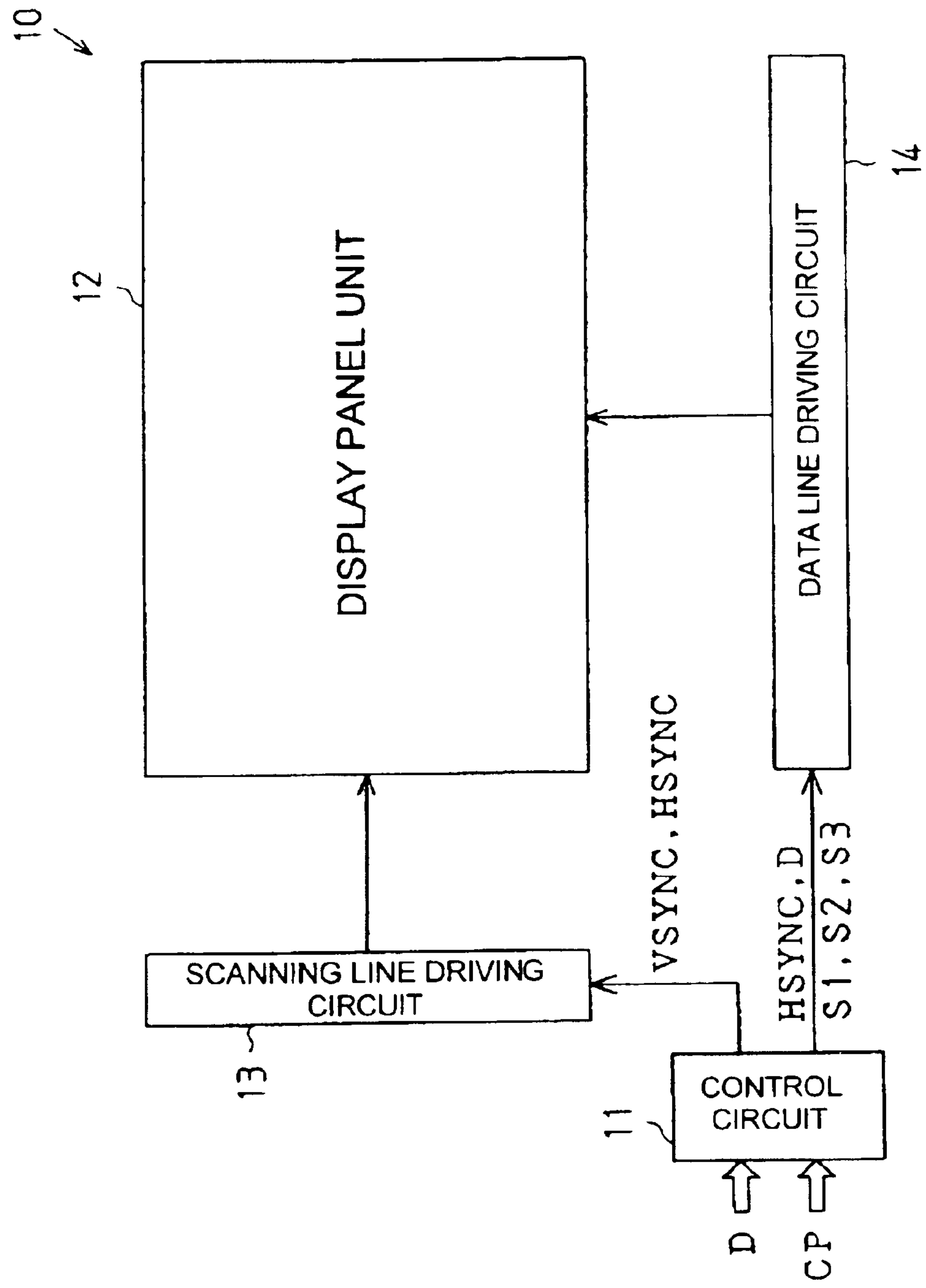
FIG. 1 is a block circuit diagram illustrating the electrical structure of an organic electroluminescent display device according to a first embodiment of the present invention.
Figure 2:
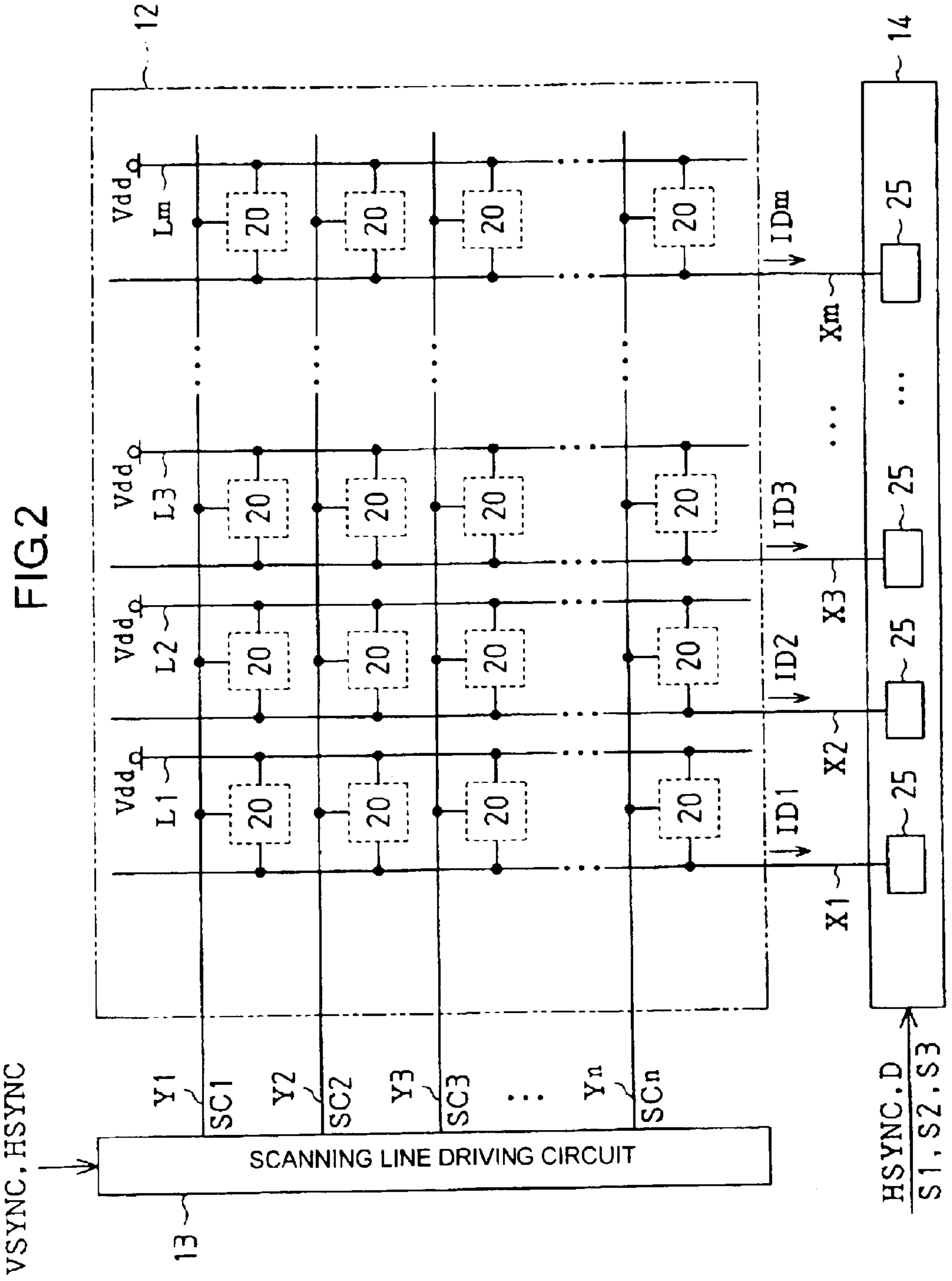
FIG. 2 is a block diagram illustrating the circuit structure of a display panel unit according to the first embodiment of the present invention.
Figure 3:
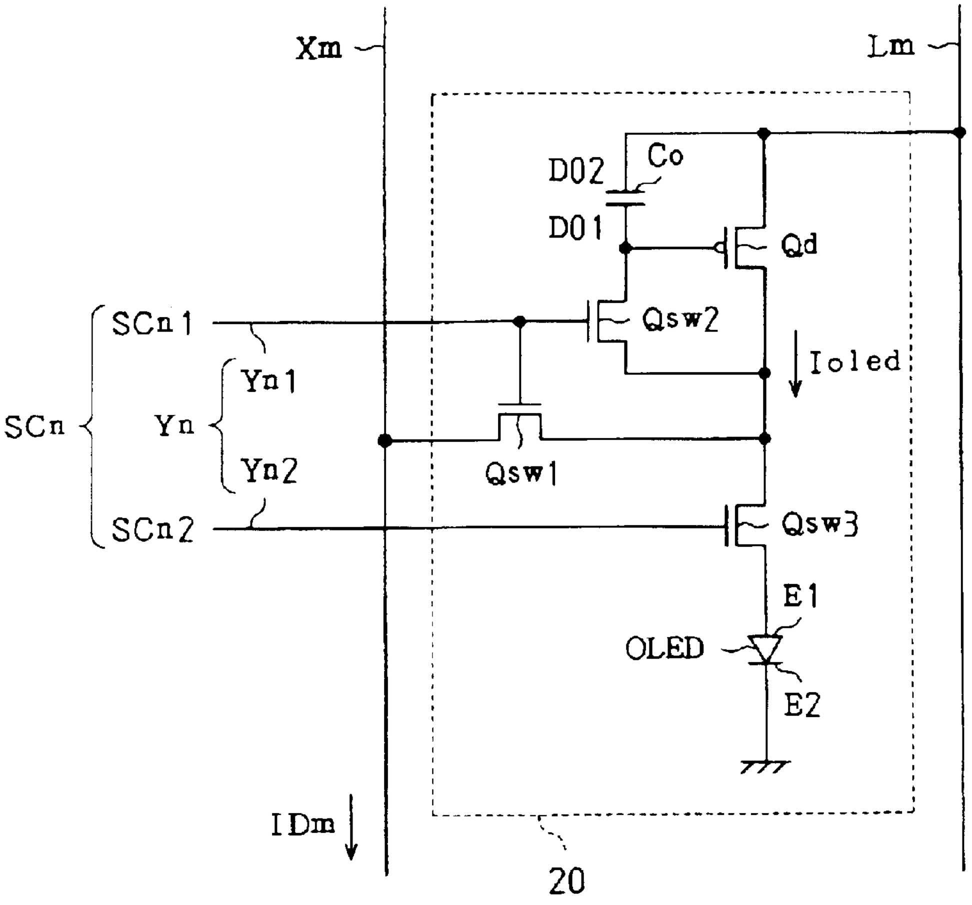
FIG. 3 is a circuit diagram of a pixel circuit according to the first embodiment of the present invention.

Hereinafter, a first embodiment implementing the present invention will be described with reference to FIGS. 1 to 9. FIG. 1 is a block circuit diagram illustrating the electrical structure of an organic electroluminescent display device employing organic electroluminescent elements as an electro-optical device. FIG. 2 is a block circuit diagram illustrating the circuit structure of a display panel unit 12. FIG. 3 is a circuit diagram illustrating the internal structure of a pixel circuit 20.

In FIG. 1, the organic electroluminescent display device 10 comprises a control circuit 11, a display panel unit 12, a scanning line driving circuit 13, and a data line driving circuit 14. Further, the organic electroluminescent display device 10 according to the present embodiment employs an active matrix driving method.

The control circuit 11, the scanning line driving circuit 13, and the data line driving circuit 14 of the organic electroluminescent display device 10 may be formed out of independent electronic components, respectively. For example, each of the control circuit 11, the scanning line driving circuit 13, and the data line driving circuit 14 may be formed out of a one-chip semiconductor integrated circuit device. Further, all or a part of the control circuit 11, the scanning line driving circuit 13, and the data line driving circuit 14 may be formed out of a programmable IC chip, where functions thereof may be implemented in software by programs written in the IC chip.

The control circuit 11 receives a clock pulse CP and image digital data D of predetermined bits (four bits in the present embodiment) from an external device (not shown). The control circuit 11 prepares a horizontal synchronization signal HSYNC for determining timings when the respective scanning lines Y1 to Yn (see FIG. 2) are sequentially selected on the basis of the clock pulse CP and a vertical synchronization signal VSYNC which is a reference signal of a frame. The horizontal synchronization signal HSYNC also performs a function of controlling timings when data signals ID1 to IDm are output to the corresponding data lines X1 to Xm (see FIG. 2), respectively.

The control circuit 11 outputs the vertical synchronization signal VSYNC and the horizontal synchronization signal HSYNC to the scanning line driving circuit 13 and also outputs the horizontal synchronization signal HSYNC to the data line driving circuit 14. Further, the control circuit 11 outputs image digital data D to the data line driving circuit 14. Furthermore, the control circuit 11 generates first to third selection signals S1 to S3 and outputs the generated selection signals to the data line driving circuit 14.

As shown in FIG. 2, the display panel unit 12 comprises m data lines X1 to Xm (where m is a natural number) arranged in a column direction thereof. Further, the display panel unit 12 comprises n scanning lines Y1 to Yn (where n is a natural number) arranged in a row direction thereof. Here, it is supposed that the m data lines X1 to Xm are arranged in the described order from the left to the right in FIG. 2. Similarly, it is also supposed that the n scanning lines Y1 to Yn are arranged in the described order from the top to the bottom in FIG. 2.

In the display panel unit 12, pixel circuits 20 as pixel portions are provided at positions corresponding to intersections of the respective data lines X1 to Xm and the respective scanning lines Y1 to Yn. The respective pixel circuits 20 are connected to the data line driving circuit 14 through the corresponding data lines X1 to Xm. In addition, the respective pixel circuits 20 are connected to the scanning line driving circuit 13 through the corresponding scanning lines Y1 to Yn. The respective pixel circuits 20 are connected to m power source lines Lm (m is a natural number) extending in the column direction. Therefore, the respective pixel circuits 20 are supplied with a driving voltage Vdd through the corresponding power source lines L1 to Lm.

FIG. 3 is a circuit diagram illustrating the internal structure of one pixel circuit 20 arranged corresponding to the intersection of the m-th data line Xm and the n-th scanning line Yn. The pixel circuit 20 comprises four transistors, a capacitive element, and an organic electroluminescent element as an electro-optical element. Specifically, the pixel circuit 20 comprises a driving transistor Qd, a first switching transistor Qsw1, a second switching transistor Qsw2, a third switching transistor Qsw3, a storage capacitor Co, and an organic electroluminescent element OLED. The driving transistor Qd is a P-type TFT (thin film transistor), and the first, second, and third switching transistors Qsw1, Qsw2, and Qsw3 are N-type TFTs. Further, the organic electroluminescent element (hereinafter, referred to as organic EL element) OLED as an electro-optical element is a light emitting element having an light emitting layer made of an organic material and emitting light by means of supply of a driving current Ioled.

The source of the driving transistor Qd is connected to the m-th power source line Lm for supplying the driving voltage Vdd. The drain of the driving transistor Qd is connected to the drain of the first switching transistor Qsw1 and the source of the second switching transistor Qsw2.

Further, the gate of the driving transistor Qd is connected to a first electrode D01 of the storage capacitor Co. A second electrode D02 of the storage capacitor Co is connected to the power source line Lm. The second switching transistor Qsw2 is connected between the gate and the drain of the driving transistor Qd.

The source of the first switching transistor Qsw1 is connected to the data line Xm. The gate of the first switching transistor Qsw1, along with the gate of the second switching transistor Qsw2, is connected to a first sub-scanning line Yn1 constituting the scanning line Yn. The drain of the first switching transistor Qsw1, along with the source of the second switching transistor Qsw2, is connected to the drain of the third switching transistor Qsw3. The source of the third switching transistor Qsw3 is connected to an anode E1 of the organic EL element OLED. A cathode E2 of the organic EL element OLED is grounded. The gate of the third switching transistor Qsw3 is connected to a second sub-scanning line Yn2 constituting the scanning line Yn. That is, in this embodiment, the scanning line Yn comprises the first sub-scanning line Yn1 and the second sub-scanning line Yn2.

On the other hand, in this embodiment, the pixel circuit 20 have comprised the driving transistor Qd, the first switching transistor Qsw1, the second switching transistor Qsw2, the third switching transistor Qsw3, the storage capacitor Co, and the organic EL element OLED, but the present invention is not limited thereto and may be changed properly. Furthermore, the channel types of the driving transistor Qd, the first switching transistor Qsw1, the second switching transistor Qsw2, and the third switching transistor Qsw3 are not limited to the aforementioned channel types, and may be selected properly as the P channel type or the N channel type.

The scanning line driving circuit 13 selects one scanning line from the n scanning lines Yn provided in the display panel unit 12 on the basis of the horizontal synchronization signal HSYNC from the control circuit 11 and outputs the corresponding scanning signal SC1 to SCn (where n is a natural number) to the selected scanning line. Specifically, the scanning line driving circuit 13 prepares first sub-scanning signals SC11, SC21, SC31, . . . , SCn1 for controlling the on and off states of the first and second switching transistors Qsw1, Qsw2 connected to the first sub-scanning line Yn1 through the first sub-scanning line Yn1 on the basis of the horizontal synchronization signal HSYNC. Further, the scanning line driving circuit 13 prepares second sub-scanning signals SC12, SC22, SC32, . . . , and SCn2 for controlling the on and off states of the third switching transistors Qsw3 connected to the second sub-scanning line Yn2 through the second sub-scanning line Yn2 on the basis of the horizontal synchronization signal HSYNC.

The first sub-scanning signals SC11 to SCn1 and the second sub-scanning signals SC12 to SCn2 constitute the scanning signals SC1 to SCn. By means of the scanning signals SC1 to SCn, the timing when electric charges corresponding to the output current (data signal) IDm to be output from the data line driving circuit 14 are written in the storage capacitor Co of the pixel circuit 20 in the selected scanning line and the timing when the organic EL element OLED emits light are controlled.

Image digital data D, the horizontal synchronization signal HSYNC, and the first to third selection signals S1 to S3 are input to the data line driving circuit 14 from the control circuit 11. As shown in FIG. 2, the data line driving circuit 14 comprises a plurality of digital-to-analog conversion circuit sections 25. The plurality of digital-to-analog conversion circuit sections 25 are connected to the corresponding data lines X1, X2, . . . , and Xm. Furthermore, the image digital data D of four bits output from the control circuit 11 are input to the respective digital-to-analog conversion circuit sections 25. Then, each digital-to-analog conversion circuit section 25 prepares the data signals ID1, ID2, . . . , and IDm which are analog current signals corresponding to the sizes of the input image digital data D. Then, the digital-to-analog conversion circuit sections 25 simultaneously output the data signals ID1, ID2, . . . , and IDm to the respective pixel circuits 20 through the corresponding data lines X1, X2, . . . , and Xm in response to the horizontal synchronization signal HSYNC output from the control circuit 11.

Figure 4:
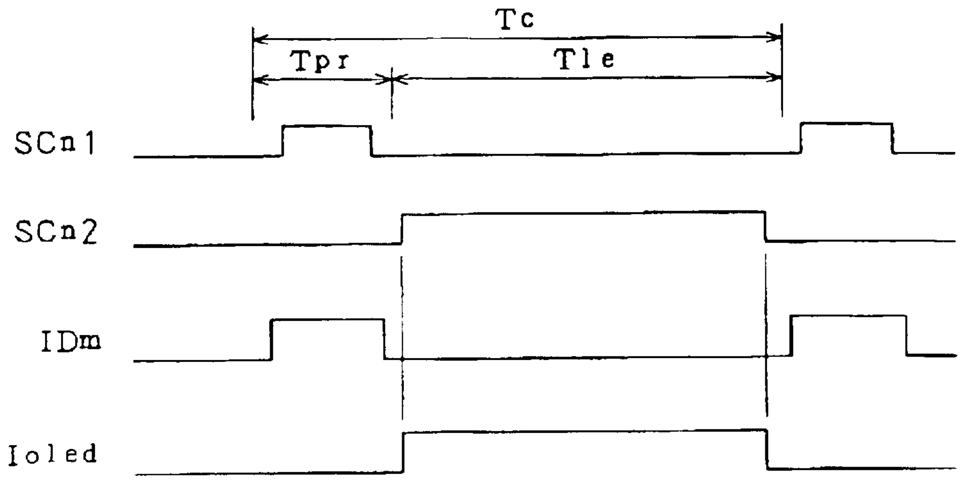
FIG. 4 is a timing chart illustrating the operation of the pixel circuit according to the first embodiment of the present invention.

FIG. 4 is a timing chart illustrating the operation of the pixel circuit 20 arranged corresponding to the intersection of the m-th data line Xm and the n-th scanning line Yn. Here, the first sub-scanning signal SCn1 input through the first sub-scanning line Yn1, the second sub-scanning signal SCn2 input through the second sub-scanning line Yn2, the data signal (output current) Idm input through the data line Xm, and the driving current Ioled flowing through the organic EL element are shown.

One frame period Tc is a time period when all the scanning lines are sequentially selected. A programming period Tpr is a programming period when the light-emitting brightness of the organic EL element is set in the pixel circuits 20 and is determined by means of the first sub-scanning signal SCn1 input through the first sub-scanning line Yn1. Tle is a light-emitting period and is determined by means of the second sub-scanning signal SCn2 input through the second sub-scanning line Yn2.

For the programming period Tpr, the digital-to-analog conversion circuit section 25 of the data line driving circuit 14 outputs the data signal (output current) IDm corresponding to the image digital data D to the data line Xm and the scanning line driving circuit 13 sets the first sub-scanning signal SCn1 of the first sub-scanning line Yn1 to H level. Then, the first switching transistor Qsw1 and the second switching transistor Qsw2 are turned on. Further, the driving transistor Qd is set to have a diode connection in which the gate and the drain thereof are connected to each other. At this time, the digital-to-analog conversion circuit section 25 of the data line driving circuit 14 serves as an electrostatic current source for flowing the data signal (output current) IDm corresponding to the image digital data D. Then, the data signal (output current) IDm output from the digital-to-analog conversion circuit section 25 flows through a path including the driving transistor Qd, the first switching transistor Qsw1, and the data line Xm. Then, electric charges corresponding to the data signal (output current) IDm are stored in the storage capacitor Co and the programming period Tpr is finished. As a result, the voltage stored in the storage capacitor Co is stored between the source and the gate of the driving transistor Qd.

When the programming period Tpr is finished, the first sub-scanning signal SCn1 becomes an L level, that is, the first sub-scanning line Yn1 becomes a non-selected state, and thus the first switching transistor Qsw1 and the second switching transistor Qsw2 are turned off. Further, the data line driving circuit 14 stops supply of the data signal (output current) IDm for the pixel circuit 20.

Subsequently, for the light-emitting period Tle, the scanning line driving circuit 13 stores the first sub-scanning signal SCn1 to an L level to keep the first switching transistor Qsw1 and the second switching transistor Qsw2 turned off. Then, the second sub-scanning signal SCn2 of the second sub-scanning line Yn2 corresponding to the first sub-scanning signal SCn1 switched to the L level becomes a H level, that is, the second sub-scanning line Yn2 becomes a non-selected state, and the third switching transistor Qsw3 is turned on. At this time, since the stored state of the electric charges in the storage capacitor Co does not vary, the gate voltage of the driving transistor Qd is kept to the voltage when the data signal IDm has flown for the programming period Tpr. For the programming period Tpr, since the driving transistor Qd is diode-connected, the source-gate voltage is equal to the source-drain voltage. That is, the driving transistor Qd always lies in the saturated region regardless of the gate voltage thereof. Therefore, for the light-emitting period Tle, the driving current Ioled with a size corresponding to the gate voltage flowing between the source and the drain of the driving transistor Qd can be expressed as the following relationship.

$$Ioled=\frac{1}{2}\times\mu 0\times Cg\times W0/L0\times(Vgs-Vth)^2$$

Here, $\mu 0$ is the mobility of carriers, Cg is gate capacity, W0 is channel width, L0 is channel length, Vgs is a gate-source voltage of the driving transistor Qd, and Vth is a threshold voltage of the driving transistor Qd.

The driving current Ioled flows through a path including the power source line L1 to Lm, the driving transistor Qd, the third switching transistor Qsw3, and the organic EL element OLED. Accordingly, the organic EL element OLED emits light with a brightness corresponding to the driving current Ioled (values of data signals). Thereafter, by sequentially selecting the scanning lines Y1, Y2, . . . , and Yn, the data signals ID1, ID2, . . . , and IDm are supplied to the respective pixel circuits 20 and thus the respective organic EL elements OLED emit lights with a brightness corresponding to the current level of the driving current Ioled. As a result, an image corresponding to the image digital data D is displayed on the display panel unit 12.

Figure 5:
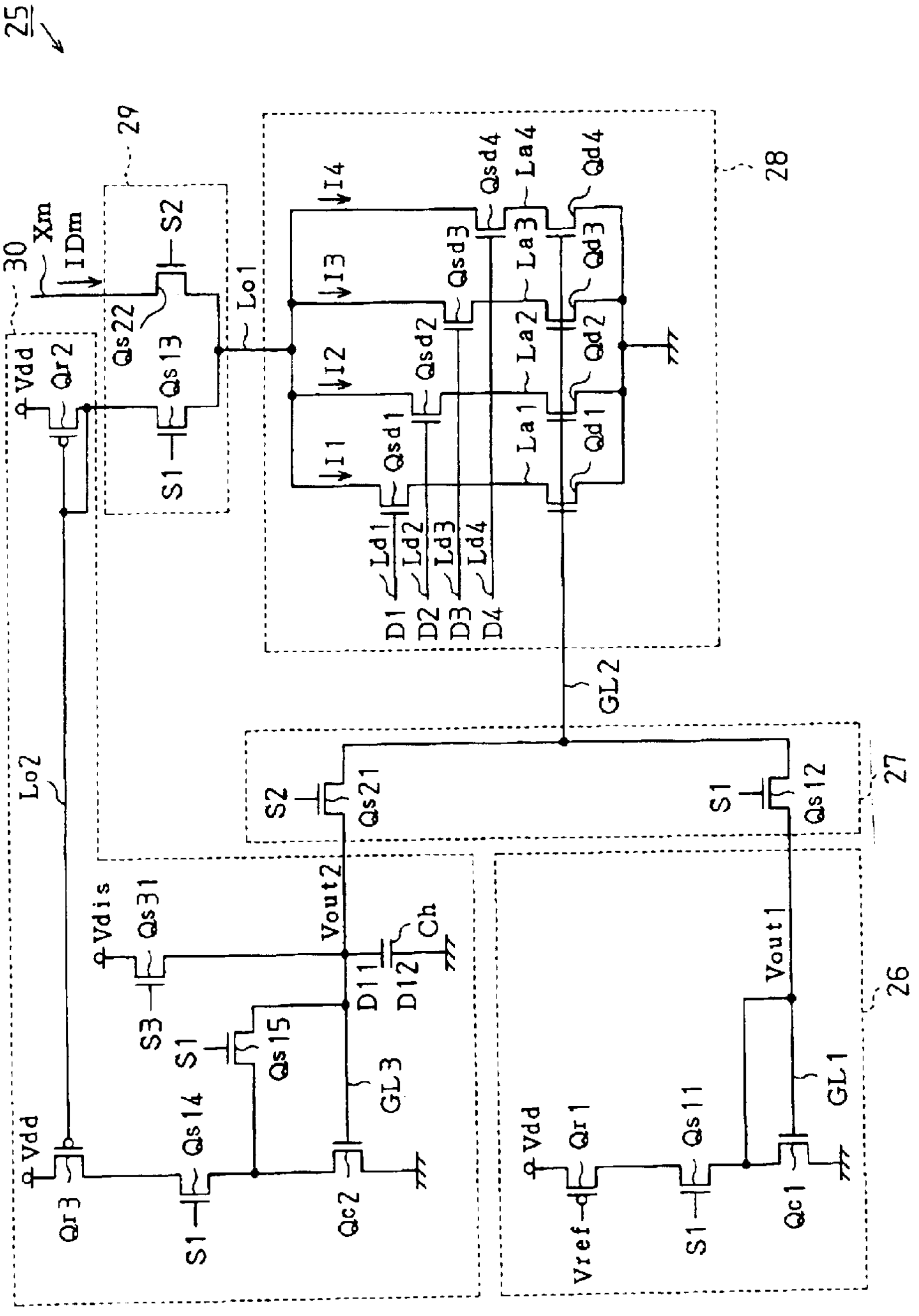
FIG. 5 is a block circuit diagram illustrating a structure of a digital-to-analog conversion circuit section according to the first embodiment of the present invention.

FIG. 5 is a diagram illustrating the internal structure of the digital-to-analog conversion circuit section 25 according to the present embodiment. The digital-to-analog conversion circuit section 25 comprises a first control circuit section 26, a first selection circuit section 27, a current adding circuit 28, a second selection circuit section 29, and a second control circuit section 30. In this embodiment, the digital-to-analog conversion circuit section 25 is a digital-to-analog conversion circuit of a current output type for converting the image digital data D (D1 to D4) of four bits into analog current, and by selectively turning on and off the first to third selection signals S1 to S3, time-sharing processing can be performed. That is, whenever the image digital data D (D1 to D4) are input to one digital-to-analog conversion circuit section 25, digital-to-analog conversion processing can be performed twice.

Specifically, the first control circuit section 26 is a circuit for generating a reference voltage and supplying the reference voltage to the current adding circuit 28 through the first selection circuit section 27. The first control circuit section 26 comprises a first reference current generating transistor Qr1, a first storage selection transistor Qs11, a first conversion transistor Qc1, and a common gate line GL1. The source of the first reference current generating transistor Qr1 is connected to the driving voltage Vdd and a reference voltage Vref is input to the gate thereof. The drain of the first reference current generating transistor Qr1 is connected to the drain of the first storage selection transistor Qs11. The first selection signal S1 input from the control circuit 11 is input to the gate of the first storage selection transistor Qs11. The source of the first storage selection transistor Qs11 is connected to the drain of the first conversion transistor Qc1 and the gate of the conversion transistor Qc1. The source of the first conversion transistor Qc1 is grounded. That is, the first conversion transistor Qc1 is diode-connected and the gate of the first conversion transistor Qc1 is connected to the common gate line GL1. Further, in the first control circuit section 26, when the first selection signal S1 of a H level is input, the first storage selection transistor Qs11 and a second storage selection transistor Qs12 are turned on and a first output voltage Vout1 corresponding to the reference voltage Vref is supplied to the current adding circuit 28 through the common gate line GL1 and the first selection circuit section 27. On the other hand, when the first selection signal S1 of an L level is input, the first storage selection transistor Qs11 and the second storage selection transistor Qs12 are turned off and the first control circuit section 26 does not supply the first output voltage Vout1 to the current adding circuit 28 through the first selection circuit section 27.

The first selection circuit section 27 is a circuit for selecting one from the output of the first control circuit section 26 and the output of the second control circuit section 30 and supplying the selected output to the current adding circuit 28, and comprises a second storage selection transistor Qs12, a first output selection transistor Qs21, and common gate lines G11 to GL3. The drain of the second storage selection transistor Qs12 is connected to the common gate line GL1, that is, the output of the first control circuit section 26, and the source thereof is connected to the input of common gate line GL2, that is, the input of the current adding circuit 28, and the source of the first output selection transistor Qs21. The first selection signal S1 is input to the gate of the second storage selection transistor Qs12. The drain of the first output selection transistor Qs21 is connected to a common gate line GL3 to be described later, that is, the output of the second control circuit section 30. The second selection signal S2 input from the control circuit 11 is input to the gate of the first output selection transistor Qs21.

Figure 6:
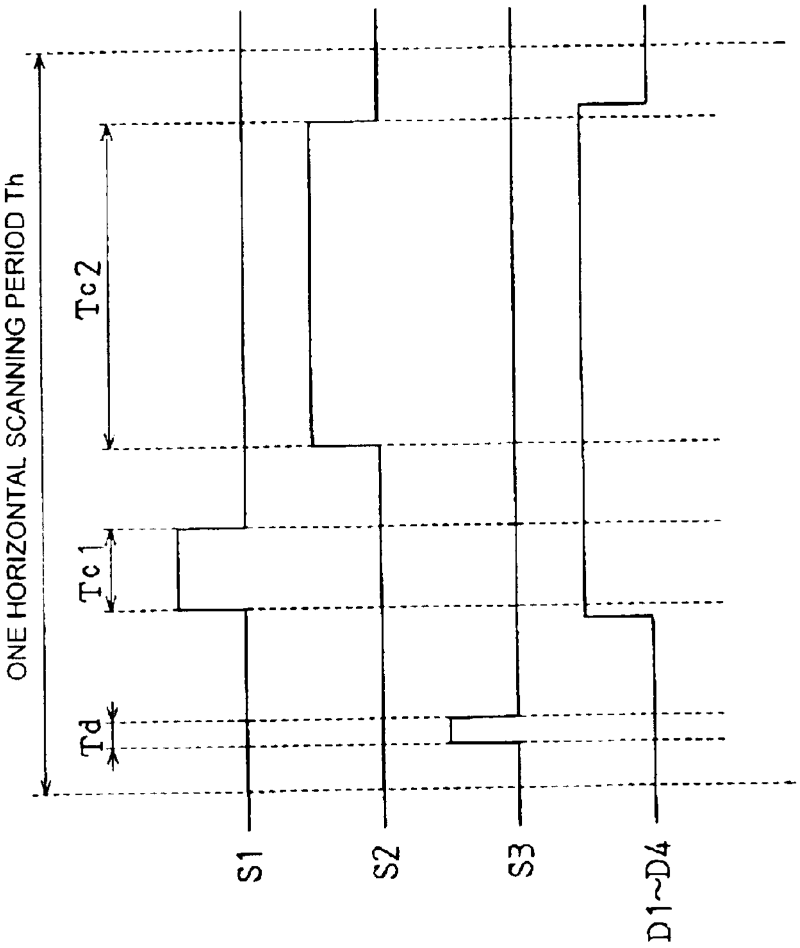
FIG. 6 is a timing chart illustrating the operation of the digital-to-analog conversion circuit section according to the first embodiment of the present invention.

As shown in FIG. 6, when the first selection signal S1 of a H level is input to the first selection circuit section 27, the second selection signal S2 has an L level and only the second storage selection transistor Qs12 is turned on, so that the first output voltage Vout1 of the first control circuit section 26 is selected and supplied to the current adding circuit 28. On the other hand, when the second selection signal S2 of a H level is input to the first selection circuit section 27, the first selection signal S1 has an L level and only the first output selection transistor Qs21 is turned on, so that the output voltage of the second control circuit section 30 is selected and supplied to the current adding circuit 28.

The current adding circuit 28 is a circuit for adding respective binary-weighted elementary currents to the input image digital data D (D1 to D4) and outputting the added elementary currents. The current adding circuit 28 comprises first to fourth switching transistors Qsd1 to Qsd4, first to fourth driving transistors Qd1 to Qd2, first to fourth current lines La1 to La4, first to fourth digital signal lines Ld1 to Ld4, the common gate line GL2, and a first output current line Lo1. The common gate line GL2 is connected to the respective gates of the first to fourth driving transistors Qd1 to Qd4. The respective sources of the first to fourth driving transistors Qd1 to Qd4 are grounded and the respective drains thereof are connected to the first to fourth current lines La1 to La4 arranged in parallel. The first to fourth current lines La1 to La4 are connected to the respective sources of the first to fourth switching transistors Qsd1 to Qsd4.

The gates of the first to fourth switching transistors Qsd1 to Qsd4 are connected to the corresponding ones of the first to fourth digital signal lines Ld1 to Ld4. The first to fourth digital signal lines Ld1 to Ld4 correspond to the respective bits of the image digital data D (D1 to D4) input from the control circuit 11. The drains of the first to fourth switching transistors Qsd1 to Qsd4 are connected to the first output current line Lo1. The first to fourth switching transistors Qsd1 to Qsd4 are transistors serving as switching elements of which the on and off states are controlled corresponding to the image digital data D (D1 to D4).

The second selection circuit section 29 is a circuit for selecting a destination circuit to which the output from the current adding circuit 28 is supplied, and comprises a third storage selection transistor Qsl3, a second output selection transistor Qs22, the first output current line Lo1, a second output current line Lo2, and an output current line (data line) Xm. The drain of the third storage selection transistor Qs 13 is connected to the second output current line Lo2. The source of the third storage selection transistor Qs13 is connected to the first output current line Lo1 and the source of the second output selection transistor Qs22 to be described later. The first selection signal S1 is input to the gate of the third storage selection transistor Qs13. The drain of the second output selection transistor Qs22 is connected to the output current line (data line) Xm. The second selection signal S2 is input to the gate of the second output selection transistor Qs22. As shown in FIG. 6, when the first selection signal S1 of a H level is input to the second selection circuit section 29, the second selection signal S2 has an L level and only the third storage selection transistor Qs13 is turned on, so that the output of the current adding circuit 28 is supplied to the second control circuit section 30. On the other hand, when the second selection signal S2 of a H level is input to the second selection circuit section 29, the first selection signal S1 has an L level and only the second output selection transistor Qs22 is turned on, so that the output of the current adding circuit 28 is output to the output current line (data line) Xm.

The second control circuit section 30 is a circuit for storing the output current of the current adding circuit 28 and then supplying the storage result as a voltage to the current adding circuit 28. The second control circuit section 30 comprises a second reference current generating transistor Qr2, a third reference current generating transistor Qr3, a fourth storage selection transistor Qsl4, a fifth storage selection transistor Qs15, a second conversion transistor Qc2, a charging transistor Qs31, a storage capacitor Ch, the second output current line Lo2, and the common gate line GL3.

The source of the second reference current generating transistor Qr2 is connected to the driving voltage Vdd. The drain of the second reference current generating transistor Qr2 is connected to the second output current line Lo2. The second reference current generating transistor Qr2 is diode-connected and the gate of the second reference current generating transistor Qr2 is connected to the second output current line Lo2 and the gate of the third reference current generating transistor Qr3. That is, the second reference current generating transistor Qr2 and the third reference current generating transistor Qr3 form a current mirror circuit. The source of the third reference current generating transistor Qr3 is connected to the driving voltage Vdd and the drain thereof is connected to the drain of the fourth storage selection transistor Qs14. The first selection signal S1 is input to the gate of the fourth storage selection transistor Qsl4. The source of the fourth storage selection transistor Qs14 is connected to the drain of the second conversion transistor Qc2 and the drain of the fifth storage selection transistor Qsl5. The source of the second conversion transistor Qc2 is grounded. The gate of the second conversion transistor Qc2 is connected to the source of the fifth storage selection transistor Qs15, the source of the charging transistor Qs31, and a first electrode D11 of the storage capacitor Ch as well as the common gate line G13. The first selection signal S1 is input to the gate of the fifth storage selection transistor Qs15. The drain of the charging transistor Qs31 is connected to a charging voltage Vdis and a third selection signal S3 from the control circuit 11 is input to the gate thereof. A second electrode D12 of the storage capacitor Ch is grounded. When the third selection signal S3 of a H level is input, the charging transistor Qs31 is turned on and the electric charges are charged in the storage capacitor Ch. On the other hand, when the third selection signal S3 of an L level is input, the charging transistor Qs31 is turned off and the electric charges corresponding to the voltage across the storage capacitor Ch is stored in the storage capacitor Ch.

As shown in FIG. 6, when the first selection signal S1 of a H level is input to the second control circuit section 30, the fourth and fifth storage selection transistors Qs14 and Qs15 are turned on and the electric charges of the voltage corresponding to the output current of the current adding circuit 28 are stored in the storage capacitor Ch.

In the example shown in FIG. 5, the first to third reference current generating transistors Qr1 to Qr3 are P channel type transistors. The first and second conversion transistors Qc1 and Qc2, the first to fourth driving transistors Qd1 to Qd4, the first to fourth switching transistors Qsd1 to Qsd4, the first to fifth storage selection transistors Qs11 to Qs15, the first and second output selection transistor Qs21 and Qs22, and the charging transistor Qs31 are N channel type transistors.

According to the digital-to-analog conversion circuit section 25 constructed in this way, by turning on and off the first to third selection signals S1 to S3 at the timings shown in FIG. 6, one digital-to-analog conversion circuit section 25 can be used in the time-sharing manner, and the digital-to-analog conversion processing can be performed twice whenever the image digital data D (D1 to D4) are input. FIG. 6 is a timing chart illustrating the operation of the digital-to-analog conversion circuit section 25 for one horizontal scanning period. Here, the first selection signal S1, the second selection signal S2, the third selection signal S3, and the image digital data D1 to D4 are shown.

Td is a charging period of the storage capacitor Ch. Tc1 is a first conversion period when first digital-to-analog conversion processing is performed. Tc2 is a second conversion period when second digital-to-analog conversion processing is performed.

For the charging period Td, the charging transistor Qs31 of FIG. 5 is turned on and the electric charges are charged in the storage capacitor Ch. Further, the charging period Td is set to be sufficient for performing the charging.

Figure 7:
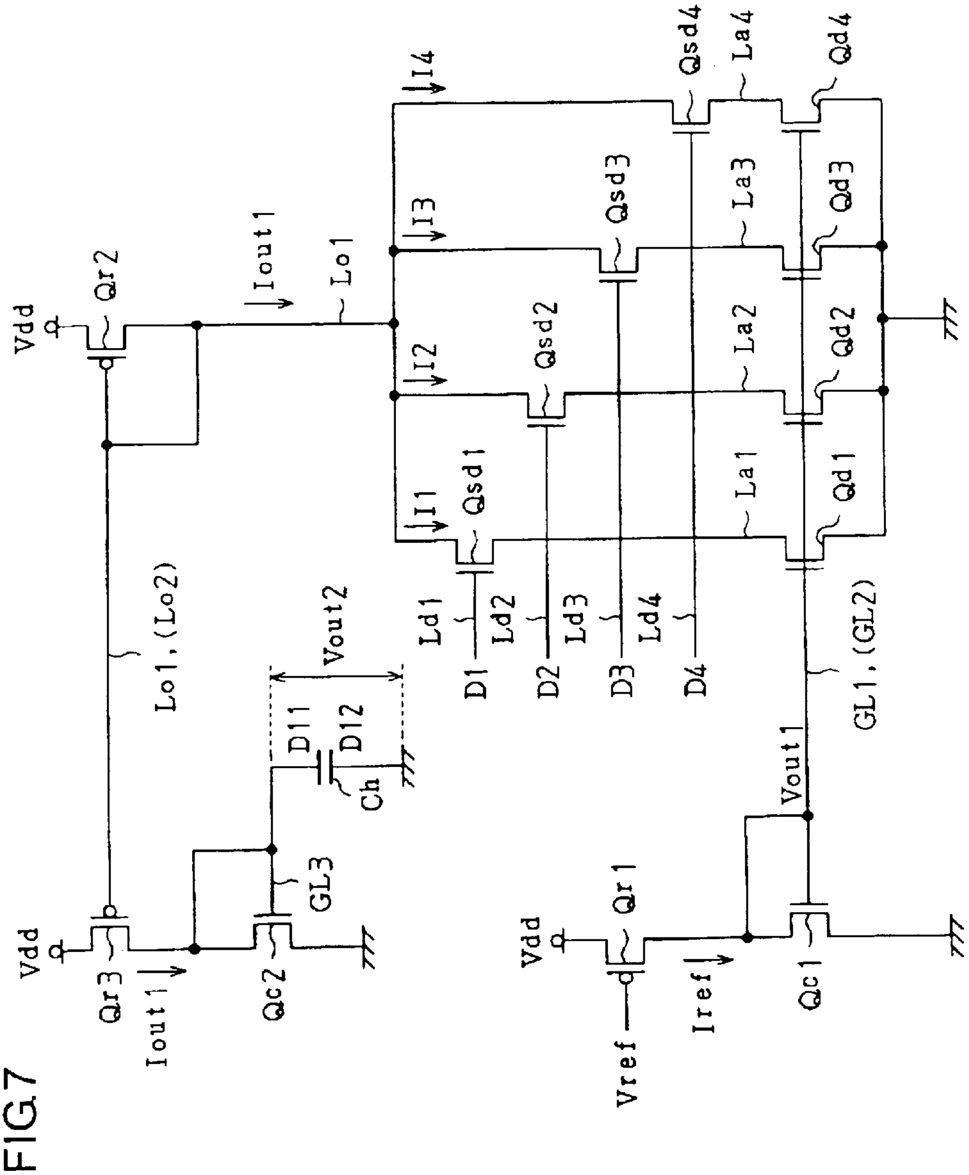
FIG. 7 is a block circuit diagram illustrating a structure of the digital-to-analog conversion circuit section for a first conversion period according to the first embodiment of the present invention.

For the first conversion period Tc1, the storage selection transistors Qs11 to Qs15 are all turned on, so that the digital-to-analog conversion circuit section 25 has a circuit structure shown equivalently in FIG. 7.

As shown in FIG. 7, for the first conversion period Tc1, the gate of the first conversion transistor Qc1 and the gates of the first to fourth driving transistors Qd1 to Qd4 are connected through the common gate lines GL1, GL2. That is, the first conversion transistor Qc1 and each of the first to fourth driving transistors Qd1 to Qd4 form a current mirror circuit. Further, the output of the current adding circuit 28 is connected to the drain of the second reference current generating transistor Qr2. The drain of the third reference current generating transistor Qr3 is connected to the drain of the second conversion transistor Qc2 and the gate and drain of the second conversion transistor Qc2 are connected to each other. That is, the second conversion transistor Qc2 is diode-connected.

Here, the ratio of gain coefficients β of the first to fourth driving transistors Qd1 to Qd4 is set to 1:2:4:8. The ratio of the gain coefficients β of the first conversion transistor Qc1 and the first driving transistor is set to 1/√K:1. Here, the gain coefficient β is defined as $\beta = M \times \beta 0 = (\mu \times C \times W/L)$, wherein M is a relative value, β0 is a predetermined integer, μ is the mobility of carriers, C is gate capacity, W is channel width, and L is channel length. The gain coefficients β of the first to fourth driving transistors Qd1 to Qd4 are set to values associated with weighting of the respective bits of the image digital data D1 to D4. For example, the image digital data D1 of a least significant bit are supplied to the first switching transistor Qsd1 connected to the first driving transistor Qd1 of which the gain coefficient β is the smallest. Further, the image digital data D4 of a most significant bit are supplied to the fourth switching transistor Qsd4 connected to the fourth driving transistor Qd4 of which the gain coefficient β is the largest.

Since the current driving ability of a transistor is proportional to the gain coefficient β, the ratio of the current driving abilities of the first conversion transistor Qc1 and the first to fourth driving transistors Qd1 to Qd4 is 1/√K: 1:2:4:8. Therefore, the current level ratio of the reference current Iref flowing through the first conversion transistor Qc1 and the first to fourth analog currents I1, I2, I3, I4 flowing through the first to fourth current lines La1, La2, La3, La4 is 1:1×√K:2×√K:4×√K:8×√K.

When the reference voltage Vref is input to the digital-to-analog conversion circuit section 25, the reference current Iref flows through the first conversion transistor Qc1. When the image digital data D (D1 to D4) of four bits is input from the control circuit 11, the first to fourth switching transistors Qsd1 to Qsd4 are turned on based on the image digital data D (D1 to D4). The currents corresponding to the current driving abilities of the first to fourth driving transistors Qd1 to Qd4, that is, the binary-weighted currents, flow through the first to fourth current lines La1 to La4 connected to the first to fourth switching transistors Qsd1 to Qsd4, which have been turned on. The total sum of the currents flowing through the respective current lines is proportional to the input image digital data D (D1 to D4) and the first output current Iout1 obtained by binary-weighting the reference current Iref flows through the first output current line Lo1. The first output current Iout1 can be expressed as the following relationship.

$$Iout1 = \sqrt{K} \times (1 \times D1 + 2 \times D2 + 4 \times D3 + 8 \times D4) \times Iref$$

The second reference current generating transistor Qr2 and the third reference current generating transistor Qr3 form a current mirror circuit. For this reason, supposed that the ratio of the gain coefficients β of the second reference current generating transistor Qr2, the third reference current generating transistor Qr3, and the second conversion transistor Qc2 is set to 1:1:1, the first output current Iout1 flows through the third reference current generating transistor Qr3 and the second conversion transistor Qc2. Here, since the second conversion transistor Qc2 is diode-connected, the first output current Iout1 is converted into the second output voltage Vout2. Then, the electric charges corresponding to the second output voltage Vout2 are stored in the storage capacitor Ch connected to the gate of the second conversion transistor Qc2. Therefore, for the first conversion period Tc1, the electric charges corresponding to the first output current Iout1 obtained by binary-weighting the reference current Iref corresponding to the reference voltage Vref are stored in the storage capacitor Ch. The first conversion period Tc1 is set to a time period sufficient for the digital-to-analog conversion and a time period when the naturally discharged electric charges can be neglected compared with the electric charges stored in the storage capacitor Ch.

Next, for the second conversion period Tc2 shown in FIG. 6, the first to fifth storage selection transistors Qs11 to Qs15 of FIG. 5 are all turned off, and then the first and second output selection transistor Qs21 and Qs22 are turned on. Then, the digital-to-analog conversion circuit section 25 has a circuit structure shown equivalently in FIG. 8.

Figure 8:
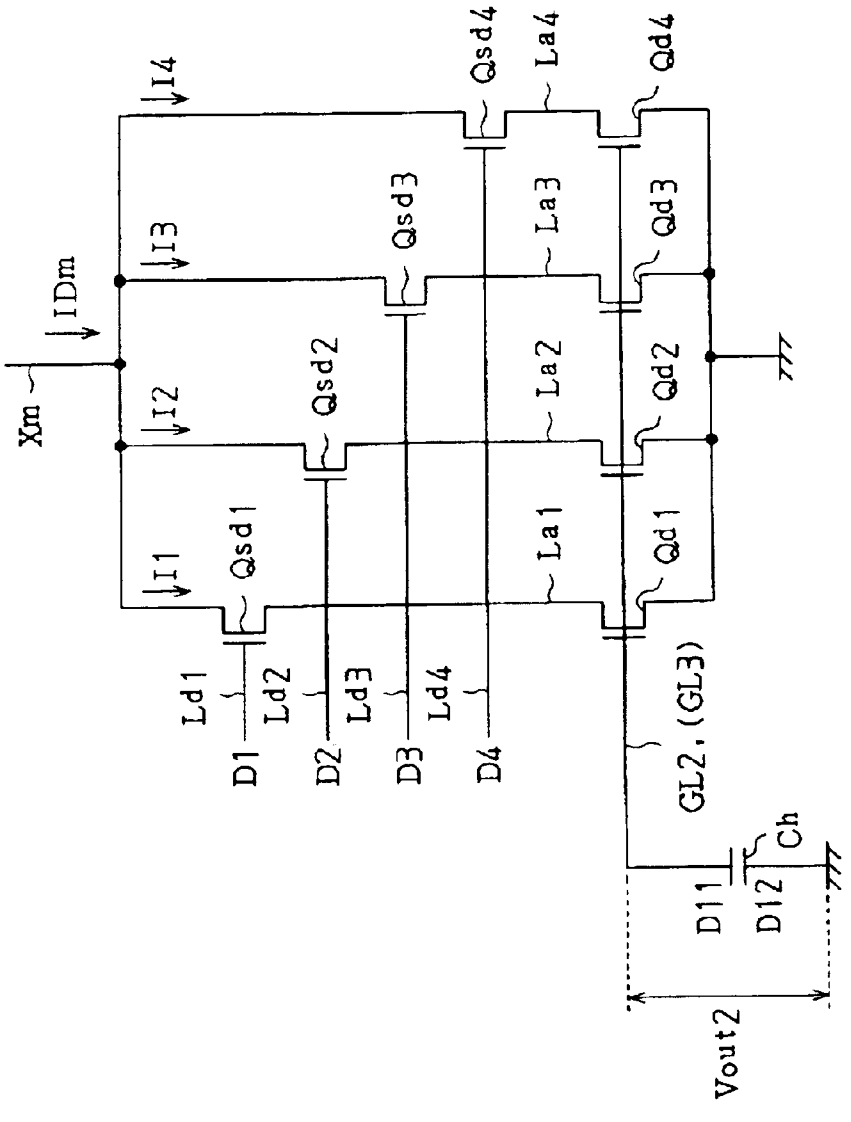
FIG. 8 is a block circuit diagram illustrating a structure of the digital-to-analog conversion circuit section for a second conversion period according to the first embodiment of the present invention.

As shown in FIG. 8, for the second conversion period Tc2, the second output voltage Vout2 corresponding to the electric charges stored in the storage capacitor Ch for the first conversion period Tc1 is input to the respective gates of the first to fourth driving transistors Qd1 to Qd4. That is, for the second conversion period Tc2, the digital-to-analog conversion processing is performed using the first output current Iout1 output from the current adding circuit 28 for the first conversion period Tc1 as the reference current. At this time, the current level ratio of the first to fourth analog currents I1, I2, I3 an I4 flowing through the first to fourth current lines La1, La2, La3, and La4 is 1×√K:2×√K:4×√K:8×√K.

Specifically, first, the image digital data D (D1 to D4) of four bits are input from the control circuit 11. Then, the current corresponding to the current driving abilities of the first to fourth driving transistors Qd1 to Qd4, that is, the binary-weighted currents flow in the first to fourth current lines La1 to La4 connected to the first to fourth switching transistors Qsd1 to Qsd4 which have been turned on based on the image digital data D (D1 to D4). The total sum of the currents flowing in the respective current lines is proportional to the input image digital data D (D1 to D4), and the output current (data signal) IDm obtained by binary-weighting the first output current Iout1 obtained for the first conversion period Tc1 flows in the output current line (data line) Xm. The second conversion period Tc2 is set to a time period sufficient for performing the digital-to-analog conversion processing and a time period sufficient for supplying the output current (data signal) IDm to the pixel circuit 20 provided in the data line Xm. The output current (data signal) IDm can be expressed as the following relationship.

$$IDM = \sqrt{K} \times (1 \times D1 + 2 \times D2 + 4 \times D3 + 8 \times D4) \times Iout1\ K \times (1 \times D1 + 2 \times D2 + 4 \times D3 + 8 \times D4)^2 \times Iref$$

That is, the output current (data signal) IDm, which is an analog current output obtained by raising the input image digital data D1 to D4 to the second power, can be obtained. Further, by changing the gain coefficient β of the first conversion transistor Qc1, the inclination of the output current (data signal) IDm can be changed. Accordingly, for example, as data signals for realizing γ=2.2 in the γ correction in the display panel unit 12, the output current (data signal) IDm, which is the 2.2 power of the image digital data D1 to D4, is obtained. In this case, it is possible to obtain the output current (data signal) IDm, which is approximately the 2.2 power of the image digital data D1 to D4 and which is also the analog current output obtained by raising the image digital data D1 to D4 to the second power.

Figure 9:
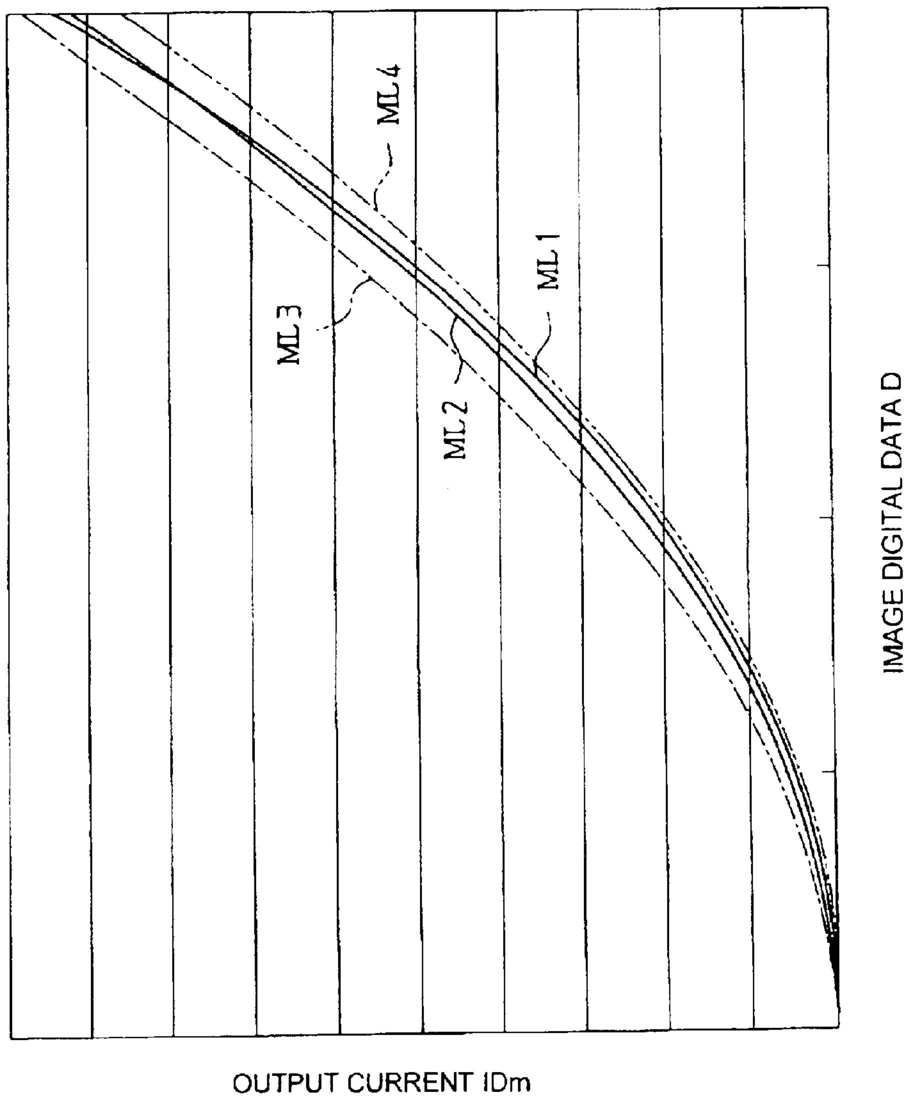
FIG. 9 is a graph illustrating the relationship between image digital data and output current according to the first embodiment of the present invention.

Specifically, as shown in FIG. 9, the output currents, which are the 2.2 power of the image digital data D1 to D4, have a waveform indicated by a characteristic curve ML1. On the other hand, when the ratio K of the gain coefficients β are set to, for example, 2.25, the output current (data signal) IDm, which is the second power of the image digital data D1 to D4, has the waveform indicated by a characteristic curve ML2 which is similar to the characteristic curve ML1. That is, while the output current (data signal) IDm is the analog current output which is the second power of the image digital data D1 to D4, it is possible to approximately obtain the output current (data signal) IDm, which is the 2.2 power of the image digital data D1 to D4, by changing the ratio of the gain coefficients β to adjust the inclination thereof. Therefore, it is possible to approximately realize the γ correction in the display panel unit 12.

The first control signal defined in claims corresponds to, for example, the first output voltage Vout1 in this embodiment. Further, the second control signal defined in claims corresponds to, for example, the second output voltage Vout2 in this embodiment. Furthermore, the elementary currents defined in claims correspond to, for example, the first to fourth analog currents I1, I2, I3 and I4 in this embodiment. Furthermore, the digital input signal defined in claims corresponds to, for example, the image digital data D (D1 to D4) of four bits in this embodiment. Furthermore, the resultant current defined in claims corresponds to, for example, the first output current Iout1 and the output current (data signal) IDm in this embodiment. Furthermore the current adding circuit defined in claims corresponds to, for example, the current adding circuit 28 in this embodiment. Furthermore, the first signal generating circuit defined in claims corresponds to, for example, the first control circuit section 26 in this embodiment. Furthermore, the second signal generating circuit defined in claims corresponds to, for example, the second control circuit section 30 in this embodiment. Furthermore, the first selection circuit defined in claims corresponds to, for example, the first selection circuit section 27 in this embodiment. Furthermore, the second selection circuit defined in claims corresponds to, for example, the second selection circuit section 29 in this embodiment. Furthermore, the external circuit defined in claims corresponds to, for example, the display panel unit 12 in this embodiment. Furthermore, the current generating circuit defined in claims corresponds to, for example, the digital-to-analog conversion circuit section 25 in this embodiment. Furthermore, the selection control circuit defined in claims corresponds to, for example, the control circuit 11 in this embodiment. Furthermore, the output signal defined in claims corresponds to, for example, the output current (data signal) IDm in this embodiment. Furthermore, the digital-to-analog conversion circuit section defined in claims correspond to, for example, the current adding circuit 28 in this embodiment.

Furthermore, the first transistors defined in claims correspond to, for example, the first to fourth driving transistors Qd1 to Qd4 in this embodiment. Furthermore, the first control terminals defined in claims correspond to, for example, the gates of the first to fourth driving transistors Qd1 to Qd4 in this embodiment. Furthermore, the second transistors defined in claims correspond to, for example, the first to fourth switching transistors Qsd1 to Qsd4 in this embodiment. Furthermore, the second control terminals defined in claims corresponds to, for example, the gates of the first to fourth switching transistors Qsd1 to Qsd4 in this embodiment. Furthermore, the current path defined in claims corresponds to, for example, the first output current line Lo1 in this embodiment. Furthermore, the storage means defined in claims corresponds to, for example, the storage capacitor Ch in this embodiment. Furthermore, the current-voltage conversion means defined in claims corresponds to, for example, the second conversion transistor Qc2 in this embodiment.

Furthermore, the electro-optical device defined in claims corresponds to, for example, the organic electroluminescent display device 10 in this embodiment.

According to the above-described embodiment, it is possible to obtain the following advantages.

(1) In the above-described embodiment, the digital-to-analog conversion circuit section 25 of a current output type provided in the data line driving circuit 14 comprises the first control circuit section 26, the first selection circuit section 27, the current adding circuit 28, the second selection circuit section 29, and the second control circuit section 30. The digital-to-analog conversion circuit section 25 is a digital-to-analog conversion circuit of a current output type for converting the image digital data D (D1 to D4) into an analog current having a linear characteristic and can perform the time-sharing processing by selectively turning on and off the first to third selection signals S1 to S3.

As a result, for the first conversion period Tc1, the electric charges corresponding to the first output current Iout1 obtained by binary-weighting the reference current Iref corresponding to the reference voltage Vref are stored in the storage capacitor Ch. Further, for the second conversion period Tc2, the second output voltage Vout2 corresponding to the electric charges stored in the storage capacitor Ch for the first conversion period Tc1 is input to the respective gates of the first to fourth driving transistors Qd1 to Qd4. That is, the digital-to-analog conversion processing is performed using the first output current Iout1 output from the current adding circuit 28 for the first conversion period Tc1 as the reference current. Therefore, by using one digital-to-analog conversion circuit of a current output type having a linear characteristic in a time-sharing manner and further performing the second digital-to-analog conversion processing using the result of the first digital-to-analog conversion processing as a reference, it is possible to obtain the analog current output which is the second power of the input image digital data D (D1 to D4).

(2) In the above-described embodiment, by using one digital-to-analog conversion circuit section 25 of a current output type having a linear characteristic in a time-sharing manner and only further performing the second digital-to-analog conversion processing using the result of the first digital-to-analog conversion processing as a reference, the analog current output which is the second power of the input image digital data D (D1 to D4) has been obtained. As a result, it is possible to generate the analog current having a non-linear characteristic from the linearly instructed grayscale data with a small number of elements and a simple circuit structure, without a complex signal processing circuit or a plurality of digital-to-analog conversion circuits. Therefore, it is possible to make the whole device small and to reduce the cost thereof.

(3) In the above-described embodiment, by changing the gain coefficient β of the first conversion transistor Qc1 provided in the digital-to-analog conversion circuit section 25, the inclination of the analog current output, which has the second power characteristic, from the digital-to-analog conversion circuit section 25 can be changed. As a result, it is possible to generate the analog current having a non-linear characteristic from the linearly instructed grayscale data with a small number of elements and a simple circuit structure, without providing a complex signal processing circuit or a plurality of digital-to-analog conversion circuits. Therefore, it is possible to make the whole device small and to reduce the cost thereof.

Second Embodiment

Next, a second embodiment implementing the present invention will be described with reference to FIGS. 6 and 9 to 12. The second embodiment is different from the first embodiment, in that an adjusting circuit 31 is added to the digital-to-analog conversion circuit section 25 described in the first embodiment, fixed resistors R1 to R4 are added to the current adding circuit 28 provided in the digital-to-analog conversion circuit section 25, and a fixed resistor R5 is added to the second selection circuit section 29. In the following embodiment, the same elements as those of the first embodiment are denoted by the same reference numerals and descriptions thereof will be omitted.

Figure 10:
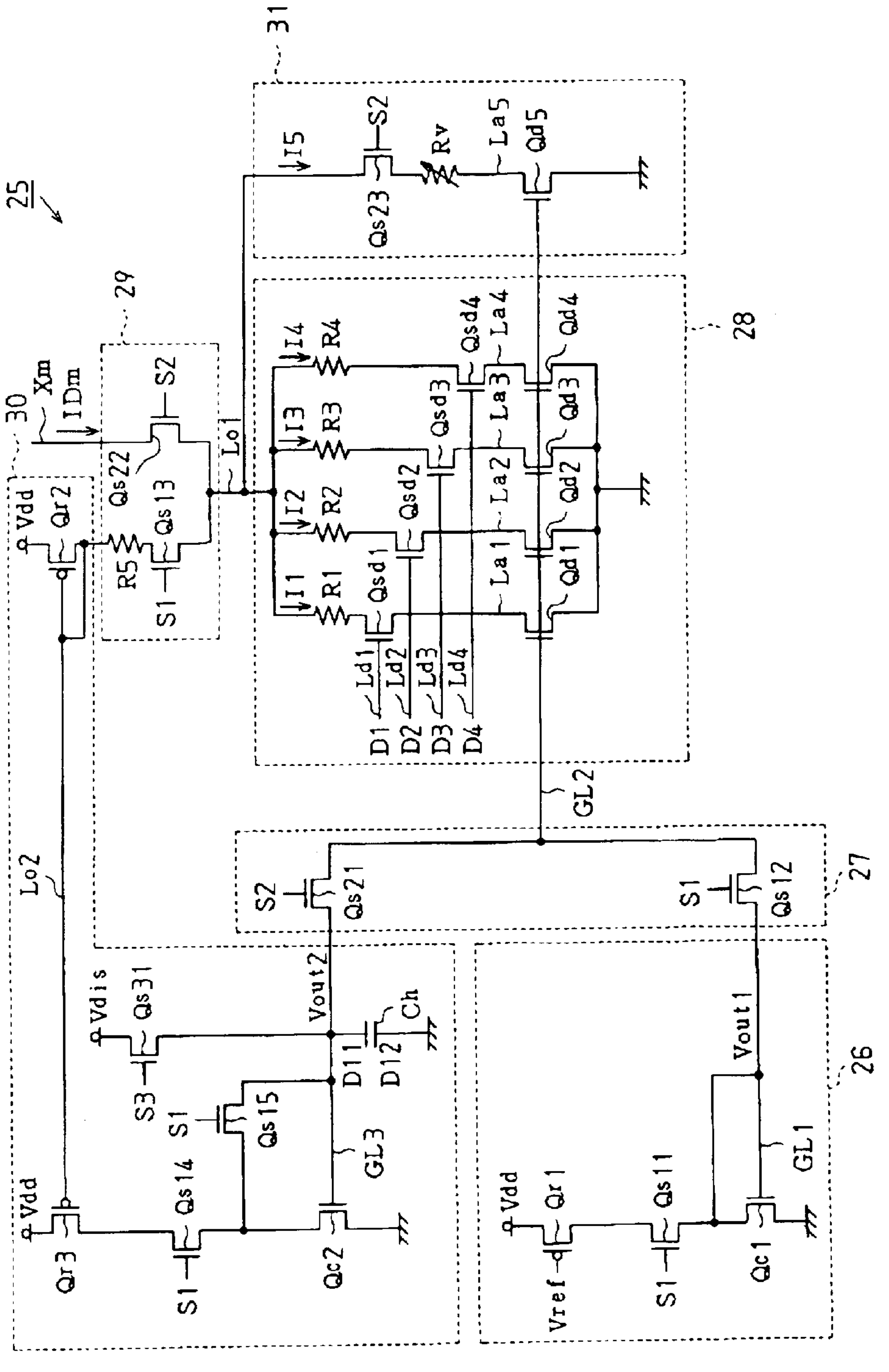
FIG. 10 is a block circuit diagram illustrating a structure of a digital-to-analog conversion circuit section according to a second embodiment of the present invention.

As shown in FIG. 10, a digital-to-analog conversion circuit section 25 comprises a first control circuit section 26, a first selection circuit section 27, a current adding circuit 28, a second selection circuit section 29, a second control circuit section 30, and an adjusting circuit 31. The adjusting circuit 31 is connected to a first output current line Lo1 in parallel with the current adding circuit 28.

In the digital-to-analog conversion circuit section 25, the current adding circuit 28 comprises fixed resistors R1 to R4, first to fourth switching transistors Qsd1 to Qsd4, first to fourth driving transistors Qd1 to Qd4, first to fourth current lines La1 to La4, and first to fourth digital signal lines Ld1 to Ld4. In this embodiment, the fixed resistors R1 to R4 are connected between the respective drains of the first to fourth switching transistors Qsd1 to Qsd4 and the first output current line Lo1 of the current adding circuit 28.

The second selection circuit section 29 comprises a third storage selection transistor Qsl3, a second output selection transistor Qs22, the first output current line Lo1, a second output current line Lo2, an output current line (data line) Xm, and a fixed resistor R5. In this embodiment, the fixed resistor R5 is connected between the drain of the third storage selection transistor Qs13 and the second output current line Lo2.

The adjusting circuit 31 comprises a third output selection transistor Qs23, a variable resistor Rv, a fifth driving transistor Qd5, a first output current line Lo1, and a fifth current line La5. The drain of the third output selection transistor Qs23 is connected to the first output current line Lo1 and the second selection signal S2 is input to the gate thereof. The variable resistor Rv is connected between the source of the third output selection transistor Qs23 and the fifth current line La5. The resistance value of the variable resistor Rv is set individually in accordance with the characteristic of the organic electroluminescent display device 10 during an inspection process at the time of the factory shipment. The source of the fifth driving transistor Qd5 is grounded and the gate thereof is connected to the common gate line GL2, along with the gates of the first to fourth driving transistors Qd1 to Qd4 provided in the current adding circuit 28. Further, the drain of the fifth driving transistor Qd5 is connected to the fifth current line La5.

According to the digital-to-analog conversion circuit section 25 constructed in this way, by turning on and off the first to third selection signals S1 to S3 at the timings shown in FIG. 6, one digital-to-analog conversion circuit section 25 can be used in the time-sharing manner and the digital-to-analog conversion processing can be thus performed twice whenever the image digital data D (D1 to D4) are input.

Figure 11:
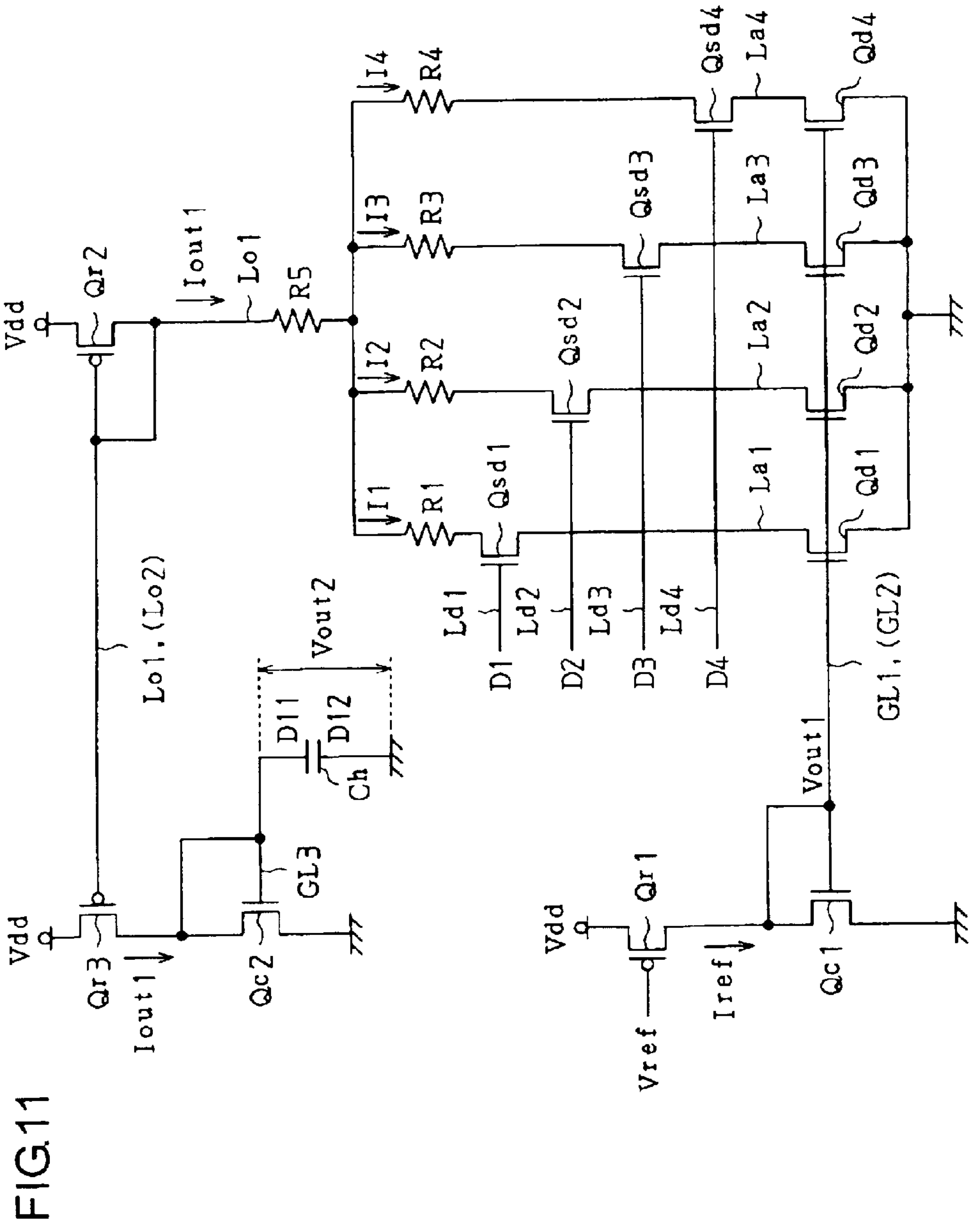
FIG. 11 is a block circuit diagram illustrating a structure of the digital-to-analog conversion circuit section for the first conversion period according to the second embodiment of the present invention.

For the first conversion period Tc1, the first to fifth storage selection transistors Qs11 to Qs15 of FIG. 10 are turned on, so that the digital-to-analog conversion circuit section 25 has the circuit structure equivalently shown in FIG. 11. The first conversion transistor Qc1 and the first to fourth driving transistors Qd1 to Qd4 form a current mirror circuit, respectively. The output of the current adding circuit 28 is connected to the fixed resistor R5. Further, the drain of the third reference current generating transistor Qr3 is connected to the drain of the second conversion transistor Qc2 and the gate and drain of the second conversion transistor Qc2 are connected to each other. That is, the second conversion transistor Qc2 is diode-connected.

Here, the ratio of gain coefficients β of the first to fourth driving transistors Qd1 to Qd4 is set to 1:2:4:8, similar to the first embodiment and the gain coefficient β of the first conversion transistor Qc1 is set to 1/√K. Further, since the current driving ability of a transistor is proportional to the gain coefficient β, the ratio of the current driving abilities of the first conversion transistor Qc1 and the first to fourth driving transistors Qd1 to Qd4 is 1/√K: 1:2:4:8. Therefore, the current level ratio of the reference current Iref flowing through the first conversion transistor Qc1 and the first to fourth analog currents I1, I2, I3, I4 flowing through the first to fourth current lines La1, La2, La3, La4 is 1:1×√K:2×√K:4×√K:8×√K. In this embodiment, supposed that the fixed resistors R1 to R4 have the resistance values which can be neglected compared with the on resistances of the first to fourth driving transistors Qd1 to Qd4, the fixed resistors R1 to R4 do not restrict the currents flowing through the first to fourth driving transistors Qd1 to Qd4. Therefore, the total sum of the currents flowing through the first to fourth current lines La1 to La4 is √K×(1×D1+2×D2+4×D3+8×D4)×Iref, similar to the first embodiment.

Supposed that the fixed resistor R5 has the resistance value which can be neglected compared with the resistances of the second and third reference current generating transistors Qr2 and Qr3, the fixed resistor R5 does not restrict the current flowing through the second conversion transistor Qc2, so that the first output current Iout1 flows in the second conversion transistor Qc2. Here, since the second conversion transistor Qc2 is diode-connected, the first output current Iout1 is converted into a second output voltage Vout2. Then, for the first conversion period Tc1, the electric charges corresponding to the second output voltage Vout2 are stored in the storage capacitor Ch connected to the gate of the second conversion transistor Qc2. Therefore, the electric charges corresponding to the first output current Iout1 obtained by binary-weighting the reference current Iref corresponding to the reference voltage Vref are stored in the storage capacitor Ch.

Next, as shown in FIG. 6, for the second conversion period Tc2, the first to fifth storage selection transistors Qs11 to Qs15 of FIG. 10 are all turned on, so that the first to third output selection transistors Qs21 to Qs23 are turned on. Then, the digital-to-analog conversion circuit section 25 has a circuit structure shown equivalently in FIG. 12.

Figure 12:
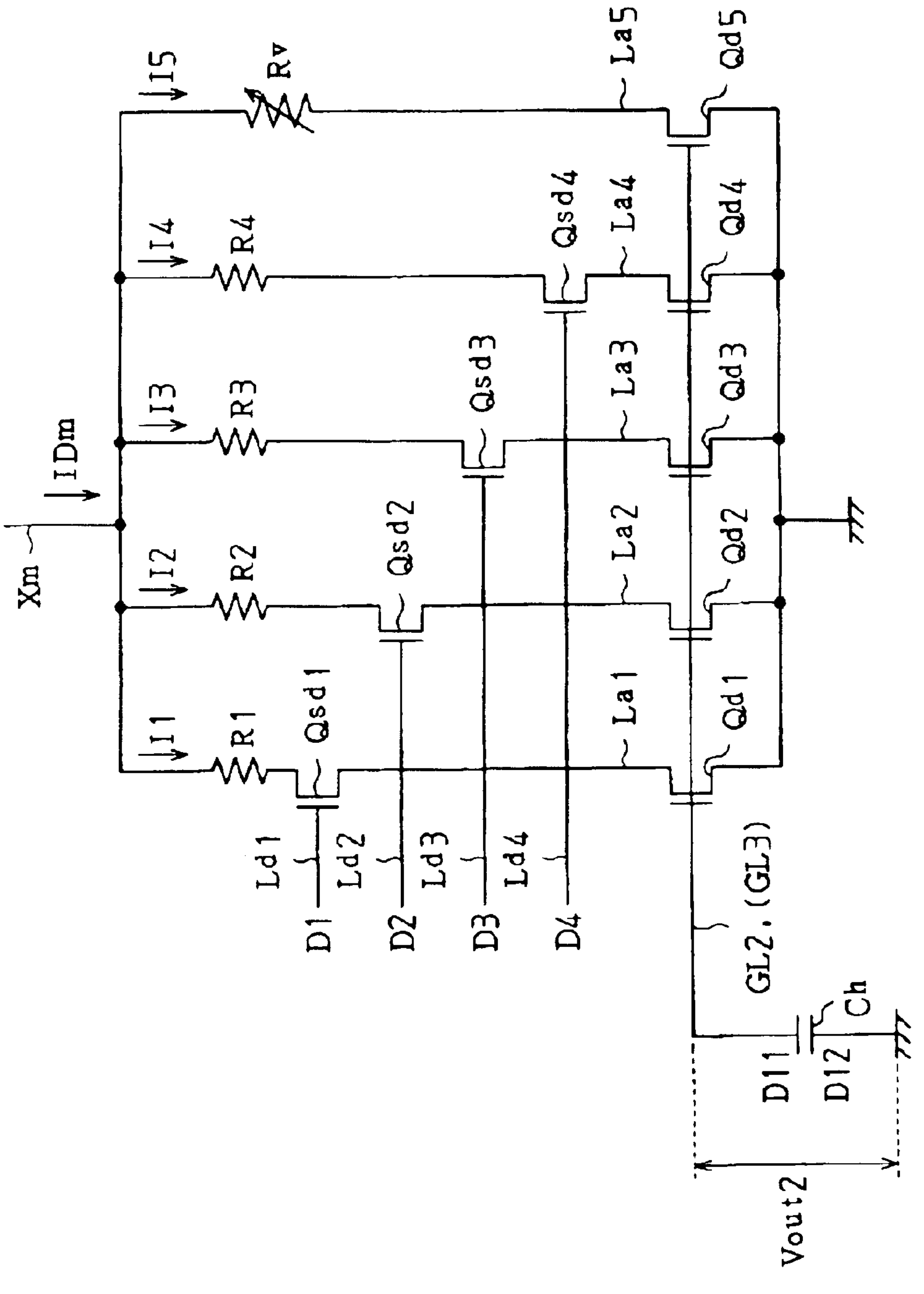
FIG. 12 is a block circuit diagram illustrating of the digital-to-analog conversion circuit section for the second conversion period according to the second embodiment of the present invention.

As shown in FIG. 12, for the second conversion period Tc2, the second output voltage Vout2 corresponding to the electric charges stored in the storage capacitor Ch for the first conversion period Tc1 is input to the respective gates of the first to fifth driving transistors Qd1 to Qd5. That is, for the second conversion period Tc2, the digital-to-analog conversion is performed using the first output current Iout1 output from the current adding circuit 28 for the first conversion period Tc1 as a reference current. At this time, the current level ratio of the first to fourth analog currents I1, I2, I3, and I4 flowing through the first to fourth current lines La1, La2, La3, and La4 is1×√K:2×√K:4×√K:8×√K.

Specifically, first, the image digital data D (D1 to D4) of four bits are input from the control circuit 11. Then, the currents corresponding to the current driving abilities of the first to fourth driving transistors Qd1 to Qd4, that is, the binary-weighted currents flow in the first to fourth current lines La1 to La4 connected to the first to fourth switching transistors Qsd1 to Qsd4 which have been turned on based on the image digital data D (D1 to D4). The total sum of the currents flowing in the respective current lines is proportional to the input image digital data D (D1 to D4) and is obtained by binary-weighting the first output current Iout1.

Here, the gain coefficient β of the fifth driving transistor Qd4 is set to the same value as the gain coefficient β of the second conversion transistor Qc2 and the ratio of the current driving abilities of the second conversion transistor Qc2 and the fifth driving transistor Qd5 is 1:1. That is, when the resistance value of the fixed resistor R5 and the resistance value of the variable resistor Rv are equal to each other, the first output current Iout1 and the fifth analog current I5 flowing through the fifth current line La5 have the same value. The fifth analog current I5 flowing through the fifth current line La5 can be expressed as the following relationship.

$$I5=(R5/Rv)\times I\text{out }1$$

That is, as the resistance value of the variable resistor Rv is decreased with respect to the fixed resistor R5, the fifth analog current I5 flowing through the fifth current line La5 is increased. The output current (data signal) IDm is the total sum of the first to fifth analog currents I1 to I5. Therefore, the output current (data signal) IDm can be expressed as the following relationship.

$$IDm=\sqrt{K}\times(1\times D1+2\times D2+4\times D3+8\times D4)\times I\text{out}1+I5=\{K\times(1\times D1+2\times D2+4\times D3+8\times D4)^2+(R1/Rv)\times\sqrt{K}\times(1\times D1+2+D2+4+D3+8+D4)\}\times I\text{ref}$$

That is, the output current (data signal) IDm, which is an analog current output obtained by raising the input image digital data D1 to D4 to the second power, can be obtained. Further, by changing the gain coefficient β of the first conversion transistor Qc1, the inclination of the output current (data signal) IDm can be changed. Accordingly, for example, as data signals for realizing γ=2.2 in the γ correction in the display panel unit 12, the output current (data signal) IDm, which is the 2.2 power of the image digital data D1 to D4, is obtained. In this case, it is possible to obtain the output current (data signal) IDm, which is approximately the 2.2 power of the image digital data D1 to D4 and which is also the analog current output obtained by raising the image digital data D1 to D4 to the second power.

Specifically, as shown in FIG. 9, the output current, which is the 2.2 power of the image digital data D1 to D4, has the waveform indicated by a characteristic curve ML1. On the other hand, when the ratio K of the gain coefficients β are set to, for example, 2.25, the output current (data signal) IDm, which is the second power of the image digital data D1 to D4, has the waveform indicated by a characteristic curve ML2, which is similar to the characteristic curve ML1. That is, while the output current (data signal) IDm is the analog current output which is the second power of the image digital data D1 to D4, it is possible to approximately obtain the output current (data signal) IDm, which is the 2.2 power of the image digital data D1 to D4, by changing the ratio of the gain coefficients β to adjust the inclination thereof.

Further, by changing the resistance value of the variable resistor Rv, the characteristic inclination of the output current (data signal) IDm can be changed. That is, as the resistance value of the variable resistor Rv is decreased with respect to the fixed resistor R5, the fifth analog current I5 flowing through the fifth current line La5 is increased, so that as indicated by the characteristic curve ML3 in FIG. 9, the inclination of the output current (data signal) IDm can be made steep. Then, as the resistance value of the variable resistor Rv is increased with respect to the fixed resistor R5, the fifth analog current I5 flowing through the fifth current line La5 is decreased, so that as indicated by the characteristic curve ML4 in FIG. 9, the inclination of the output current (data signal) IDm can be made smooth. Therefore, it is possible to obtain the output having a wider non-linearity as well as the output which is the second power of the image digital data D (D1 to D4), and to approximately realize the γ correction in the display panel unit 12.

The second elementary current defined in claims corresponds to, for example, the fifth analog current I5 in this embodiment. The adjusting circuit defined in claims corresponds to, for example, the adjusting circuit 31 in this embodiment.

According to the above-described embodiment, the following advantages can be obtained in addition to the advantages of the first embodiment.

(1) In the above-described embodiment, the adjusting circuit 31 is added to the digital-to-analog conversion circuit section 25 which can perform the time-sharing processing, the fixed resistors R1 to R4 are added to the current adding circuit 28 provided in the digital-to-analog conversion circuit section 25, and the fixed resistor R5 is added to the second selection circuit section 29. Since the adjusting circuit 31 comprises the third output selection transistor Qs23, the variable resistor Rv, and the fifth driving transistor Qd, it is possible to change the current value flowing through the fifth current line La5 by changing the resistance value of the variable resistor Rv. As a result, it is possible to obtain the analog current having the wider non-linearity as well as the second-powered analog current, without providing a complex signal processing circuit or a plurality of digital-to-analog conversion circuits.

(2) In the above-described embodiment, by only changing the value of the variable resistor Rv provided in the digital-to-analog conversion circuit section 25 which can perform the time-sharing processing, it is possible to generate the analog current having the wider non-linear characteristic as well as the second-powered non-linear characteristic with a small number of elements and a simple circuit structure. Therefore, it is possible to make the whole device small and to reduce the cost thereof.

Third Embodiment

Next, a third embodiment implementing the present invention will be described with reference to FIGS. 6, 7, 9, 13, and 14. The third embodiment is different from the first embodiment, in that an adjusting circuit 32 is added to the digital-to-analog conversion circuit section 25 described in the first embodiment. In the following embodiment, the same elements as those of the first embodiment are denoted by the same reference numerals and descriptions thereof will be omitted.

Figure 13:
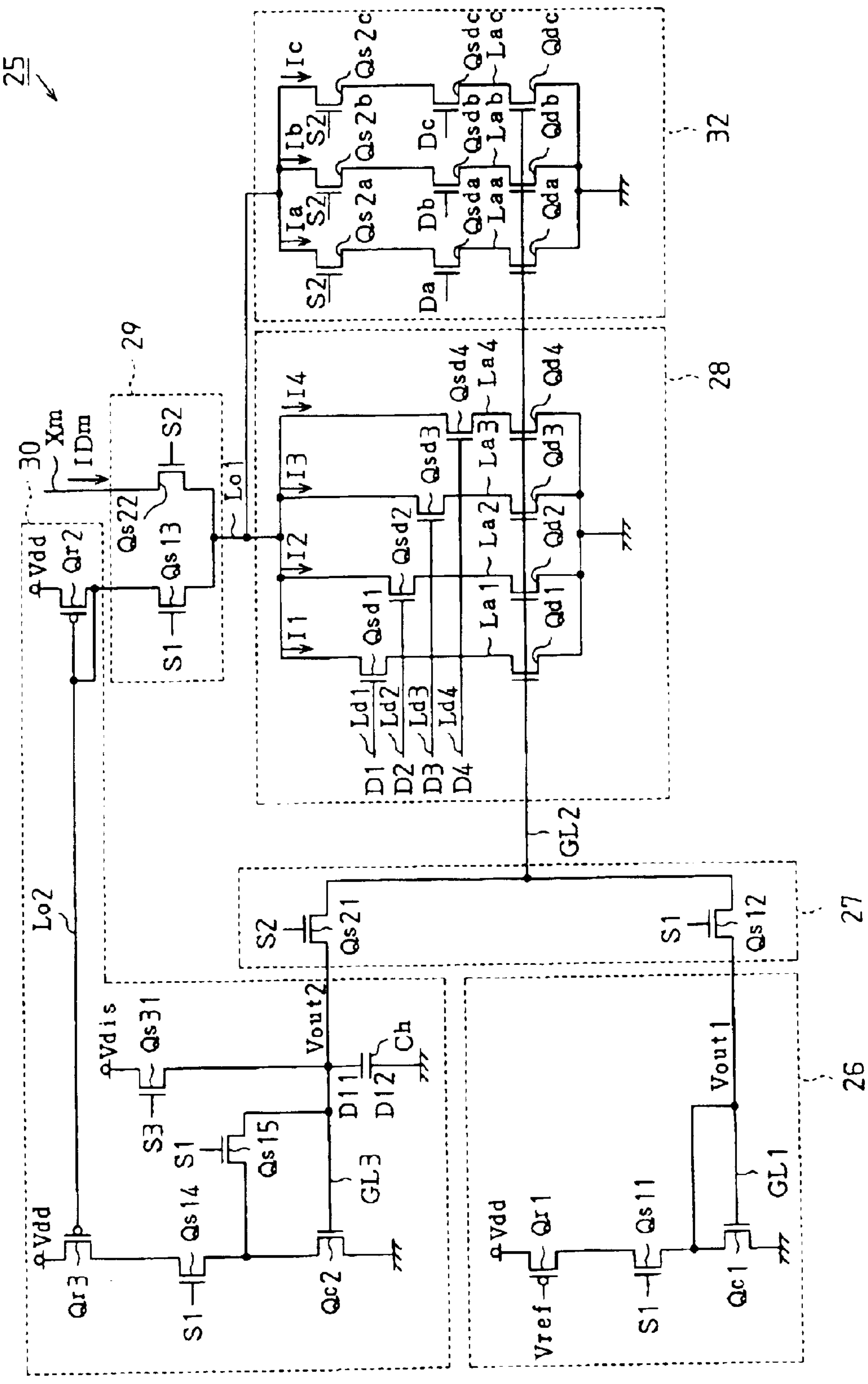
FIG. 13 is a block circuit diagram illustrating a structure of a digital-to-analog conversion circuit section according to a third embodiment of the present invention.

As shown in FIG. 13, the adjusting circuit 32 is connected to the first output current line Lo1 in parallel with the current adding circuit 28. The adjusting circuit 32 comprises fifth to seventh switching transistors Qsda, Qsdb, Qsdc, fifth to seventh driving transistors Qda, Qdb, Qdc, and third to fifth output selection transistors Qs2*a*, Qs2*b*, Qs2*c*. Further, the adjusting circuit 32 comprises fifth to seventh current lines Laa, Lab, and Lac.

The gates of the fifth to seventh driving transistors Qda, Qdb, and Qdc are connected to the first to fourth driving transistors Qd1 to Qd4 of the current adding circuit 28 through the common gate line GL2 and the sources thereof are grounded. The drains of the fifth to seventh driving transistors Qda, Qdb, and Qdc are connected to the fifth to seventh current lines Laa, Lab, and Lac arranged in parallel, respectively. The fifth to seventh current lines Laa, Lab, and Lac are connected to the corresponding sources of the fifth to seventh switching transistors Qsda, Qsdb, and Qsdc. The digital signals Da, Db, and Dc are input to the gates of the fifth to seventh switching transistors Qsda, Qsdb, and Qsdc from the control circuit 11. The digital signals Da, Db, and Dc are signals for selectively turning on any one of the fifth to seventh switching transistors Qsda, Qsdb, and Qsdc. For example, when the digital signal Da has a H level, only the fifth switching transistor Qsda is turned on. On the other hand, the digital signals Db and Dc become an L level, so that the sixth and seventh switching transistors Qsdb and Qsdc are turned off.

The drains of the fifth to seventh switching transistors Qsda, Qsdb, and Qsdc are connected to the sources of the third to fifth output selection transistors Qs2*a*, Qs2*b*, and Qs2*c*. The drains of the third to fifth output selection transistors Qs2*a*, Qs2*b*, and Qs2*c* are connected to the first output current line Lo1 and the second selection signal S2 is input to the gates thereof.

According to the digital-to-analog conversion circuit section 25 constructed in this way, by turning on and off the first to third selection signals S1 to S3 at the timings shown in FIG. 6, one digital-to-analog conversion circuit section 25 can be used in the time-sharing manner, so that the digital-to-analog conversion processing can be performed twice whenever the image digital data D (D1 to D4) are input.

For the first conversion period Tc1, the first to fifth storage selection transistors Qs11 to Qs15 of FIG. 13 are turned on, so that the digital-to-analog conversion circuit section 25 has the circuit structure equivalently shown in FIG. 7, similar to the first embodiment. The total sum of the currents flowing through the first to fourth current lines La1 to La4 is √K×(1×D1+2×D2+4×D3+8×D4)×Iref, similar to the first embodiment. Further, since the second reference current generating transistor Qr2 and the third reference current generating transistor Qr3 form a current mirror circuit, the first output current Iout1 flows in the third reference current generating transistor Qr3 and the second conversion transistor Qc2. Here, since the second conversion transistor Qc2 is diode-connected, the first output current Iout1 is converted into the second output voltage Vout2. Therefore, for the first conversion period Tc1, the electric charges corresponding to the first output current Iout1 obtained by binary-weighting the reference current Iref corresponding to the reference voltage Vref are stored in the storage capacitor Ch.

Next, as shown in FIG. 6, for the second conversion period Tc2, the first to fifth storage selection transistors Qs11 to Qs15 of FIG. 13 are all turned on, and then the first to fifth output selection transistor Qs21, Qs22, Qs2*a*, Qs2*b*, Qs2*c* are turned on. Then, the digital-to-analog conversion circuit section 25 has a circuit structure shown equivalently in FIG. 14.

Figure 14:
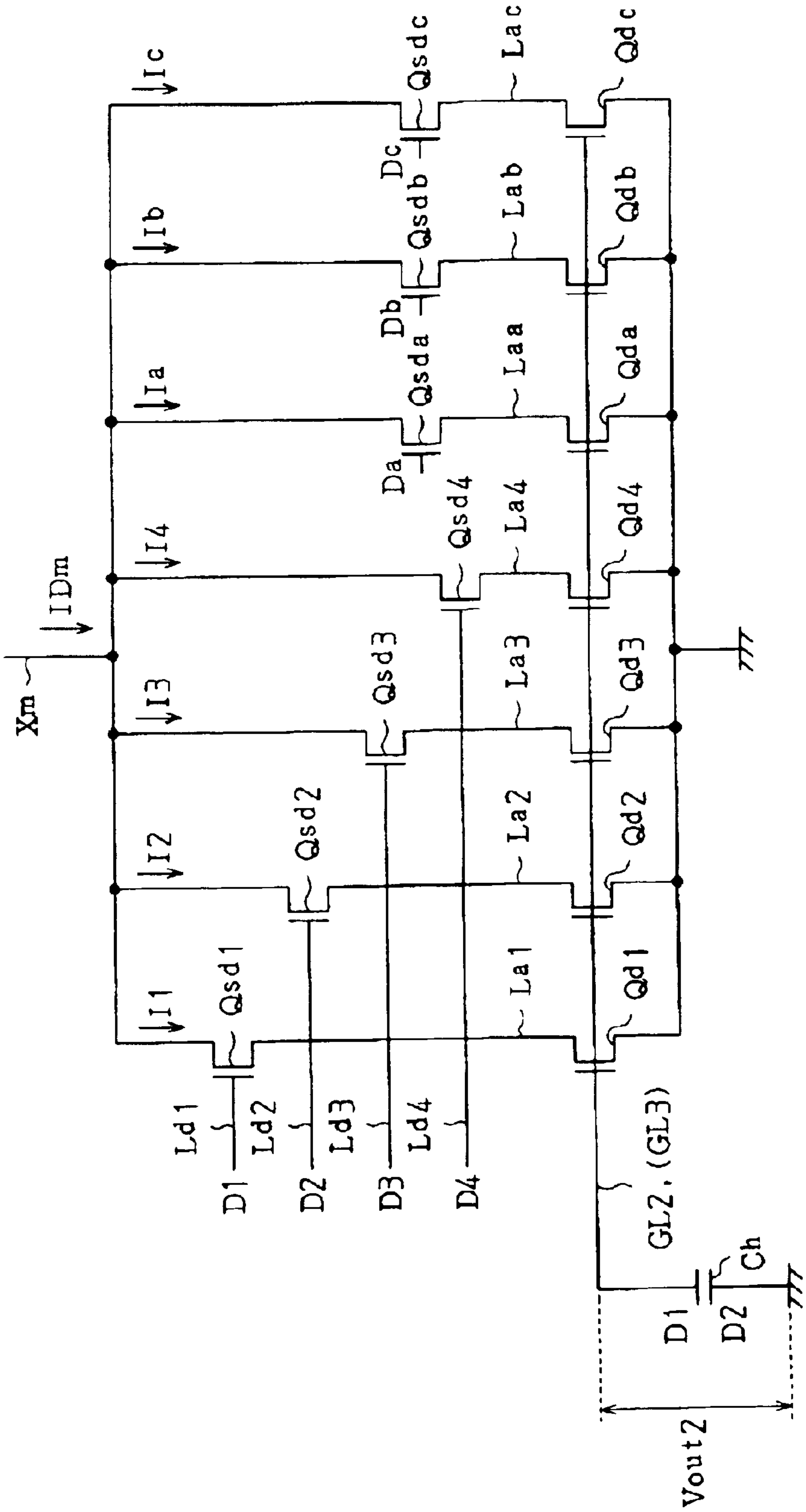
FIG. 14 is a block circuit diagram illustrating a structure of the digital-to-analog conversion circuit section for the second conversion period according to the third embodiment of the present invention.

As shown in FIG. 14, for the second conversion period Tc2, the second output voltage Vout2 corresponding to the electric charges stored in the storage capacitor Ch for the first conversion period Tc1 is input to the respective gates of the first to seventh driving transistors Qd1 to Qd4, Qda, Qdb, and Qdc. That is, for the second conversion period Tc2, the digital-to-analog conversion is performed using the first output current Iout1 output from the current adding circuit 28 for the first conversion period Tc1 as a reference current.

At this time, the ratio of the gain coefficients β of the second conversion transistor Qc2 and the fifth to seventh driving transistors Qda, Qdb, and Qdc is set to 1:a:b:c, which are different from each other. Therefore, the ratio of the current driving abilities of the second conversion transistor Qc2 and the fifth to seventh driving transistors Qda, Qdb, and Qdc is 1:a:b:c. In the fifth to seventh switching transistors Qsda, Qsdb, and Qsdc, since any one of the analog currents Ia, Ib, and Ic flowing through the fifth to seventh current lines Laa, Lab, and Lac is selectively turned on, it is supposed that the selected current is Iq and the current driving ability is Q. Then, Iq can be expressed as the following relationship.

$$Iq=Q\times Iout\mathbf{1} \text{ (where } Q \text{ is any one of } a, b, \text{ and } c)$$

The total sum of the currents flowing through the first to fourth current lines La1 to La4 is √K×(1×D1+2×D2+4×D3+8×D4)×Iout1, similar to the first embodiment.

Therefore, the output current (data signal) IDm of the digital-to-analog conversion circuit section 25 is equal to the total sum of the first to fourth analog currents I1 to I4 and the analog current Iq, which can be expressed as the following relationship.

$$IDm=\sqrt{K}\times(1\times D1+2\times D2+4\times D3+8\times D4)\times Iout1+Q\times Iout1=\{K\times(1\times D1+2\times D2+4\times D3+8\times D4)^2+Q\times\sqrt{K}\times(1\times D1+2\times D2+4\times D3+8\times D4)\}\times Iref$$

That is, the output current (data signal) IDm which is an analog current output obtained by raising the input image digital data D1 to D4 to the second power can be obtained. Further, by changing the gain coefficient β of the first conversion transistor Qc1, the inclination of the output current (data signal) IDm can be changed. Accordingly, for example, as the data signal for realizing γ=2.2 in the γ correction in the display panel unit 12, the output current (data signal) IDm, which is the 2.2 power of the image digital data D1 to D4, is obtained. In this case, it is also possible to obtain the output current (data signal) IDm, which is approximately the 2.2 power of the image digital data D1 to D4 and which is also the analog current output obtained by raising the image digital data D1 to D4 to the second power.

Specifically, as shown in FIG. 9, the output current, which is the 2.2 power of the image digital data D1 to D4, has the waveform indicated by the characteristic curve ML1. On the other hand, when the ratio K of the gain coefficients β is set to, for example, 2.25, the output current (data signal) IDm, which is the second power of the image digital data D1 to D4, has the waveform indicated by the characteristic curve ML2, which is similar to the characteristic curve ML1. That is, while the output current (data signal) IDm is the analog current output which is the second power of the image digital data D1 to D4, it is possible to approximately obtain the output current (data signal) IDm, which is the 2.2 power of the image digital data D1 to D4, by changing the ratio of the gain coefficients β to adjust the inclination thereof.

By selecting any one of the fifth to seventh driving transistors Qda, Qdb, and Qdc, the inclination of the output current (data signal) IDm can be changed. For example, the ratio of the gain coefficients β is a<b<c, the inclination of the output current (data signal) IDm can be made steep in the order of the fifth to seventh driving transistors Qda, Qdb, and Qdc. That is, when the seventh driving transistor Qdc is selected, for example, as indicated by the characteristic curve ML3 of FIG. 9, the inclination of the output current (data signal) IDm can be made steep. Further, when the fifth driving transistor Qda is selected, for example, as indicated by the characteristic curve ML4 of FIG. 9, the inclination of the output current (data signal) IDm can be made smooth. Therefore, the output having a wider non-linearity can be obtained, so that it is possible to approximately perform the γ correction in the display panel unit 12.

The second elementary current defined in claims corresponds to, for example, the analog currents Ia, Ib, and Ic in this embodiment. Further, the adjusting circuit defined in claims corresponds to, for example, the adjusting circuit 32 in this embodiment.

According to the above-described embodiment, it is possible to obtain the following advantages, in addition to the advantages of the first embodiment.

(1) In the above-described embodiment, the adjusting circuit 32 is connected to the first output current line Lo1 of the digital-to-analog conversion circuit section 25 which can perform the time-sharing processing, in parallel with the current adding circuit 28. The adjusting circuit 32 comprises the fifth to seventh switching transistors Qsda, Qsdb, and Qsdc, the fifth to seventh driving transistors Qda, Qdb, and Qdc, the third to fifth output selection transistors Qs2*a*, Qs2*b*, Qs2*c*, and the fifth to seventh current lines Laa, Lab, Lac. By selecting any one of the fifth to seventh driving transistors Qda, Qdb, and Qdc, the current values flowing through the fifth to seventh current lines Laa, Lab, and Lac are changed. As a result, it is possible to obtain the analog current having the wider non-linearity as well as the second-powered non-linear characteristic, without providing a complex signal processing circuit or a plurality of digital-to-analog conversion circuits.

(2) In the above-described embodiment, the fifth to seventh driving transistors Qda, Qdb, and Qdc are provided in the digital-to-analog circuit section 25 which can perform the time-sharing processing. By only selecting any one of the fifth to seventh driving transistors Qda, Qdb, and Qdc, it is possible to generate the analog current having the wider non-linear characteristic as well as the second-powered non-linear characteristic about the input image digital data D (D1 to D4) with a small number of elements and a simple circuit structure. Therefore, it is possible to make the whole device small and to reduce the cost thereof.

Fourth Embodiment

Next, an application example in which the organic electroluminescent display device 10 employing the organic EL elements as the electro-optical device described in the first to third embodiments is applied to an electronic apparatus will be described with reference to FIG. 15. The organic electroluminescent display device 10 can be applied to various electronic apparatuses such as a mobile personal computer, a mobile phone, a viewer, a portable intelligence terminal such as a game machine, an electronic book, an electronic paper, and the like. Furthermore, the organic electroluminescent display device 10 can be applied to various electronic apparatuses such as a video camera, a digital camera, a car navigation apparatus, a car stereo apparatus, a driver manipulation panel, a personal computer, a printer, a scanner, a television, a video player, and the like.

Figure 15:
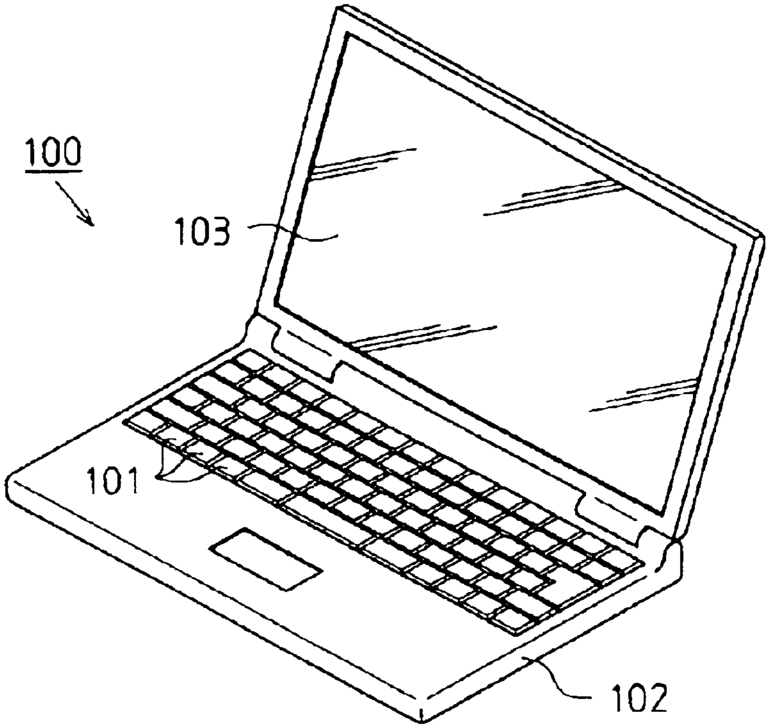
FIG. 15 is a perspective view illustrating a structure of a mobile personal computer according to a fourth embodiment of the present invention.

FIG. 15 is a perspective view illustrating a structure of a mobile personal computer. In FIG. 15, the mobile personal computer 100 comprises a body 102 having a keyboard 101 and a display unit 103 employing the organic electroluminescent display device 10. In this case, the display unit 103 employing the organic electroluminescent display device 10 has the same advantages as the first to third embodiments. As a result, the mobile personal computer 100 can realize the display having excellent display quality.

Further, the above-described embodiments may be modified as follows.

In the second embodiment, the resistance value of the variable resistor Rv is fixed individually in accordance with the characteristic of the organic electroluminescent display device 10 during an inspection process at the time of the factory shipment. Instead, by forming the variable resistor Rv with a resistive element and an analog switch and selecting the analog switch using a program for performing the resistance adjusting function which is written in an IC chip, the resistance value of the variable resistor Rv may be varied in real time corresponding to display images.

In the third embodiment, by employing three kinds of the fifth to seventh driving transistors Qda, Qdb, and Qdc and the fifth to seventh switching transistors Qsda, Qsdb, and Qsdc having different gain coefficients β and selectively turning on the transistors, the non-linear inclination is changed. Instead, by combining two or more kinds of the fifth to seventh switching transistors Qsda, Qsdb, and Qsdc and turning on the two or more transistors, the non-linear inclination may be changed.

In the third embodiment, by employing three kinds of the fifth to seventh driving transistors Qda, Qdb, and Qdc and the fifth to seventh switching transistors Qsda, Qsdb, and Qsdc having different gain coefficients β, the non-linear inclination is changed. Instead, by employing driving transistors having two or four or more kinds of gain coefficients β and switching transistors corresponding thereto and selectively turning on them, the non-linear inclination may be changed. Alternatively, by combining two or more kinds of two kinds or three or more kinds of switching transistors and turning on the combined ones, the non-linear inclination may be changed. Alternatively, by combining two or more of the two or more driving transistors having the same gain coefficient β and switching transistors corresponding thereto and turning on the combined ones, the non-linear inclination may be changed. Alternatively, by selecting the switching transistors in real time corresponding to display images using a program for performing a function of selectively turning on the switching transistors, the program being written in an IC chip, the non-linear inclination may be changed.

In the above embodiments, by setting the ratio of the gain coefficients β of the first conversion transistor Qc1 and the first driving transistor Qd1 to 1/√K:1, the inclination K of the output of the digital-to-analog conversion circuit section 25 is set. Instead, by setting the ratio of the gain coefficients β of the first conversion transistor Qc1 and the first driving transistor Qd 1 to 1:1 and setting the ratio of the gain coefficients β of the second reference current generating transistor Qr2 and the third reference current generating transistor Qr3 to 1√K:1, the inclination K of the output of the digital-to-analog conversion circuit section 25 may be set. Alternatively, by setting the ratio of the gain coefficients β of the first conversion transistor Qc1 and the first driving transistor Qd1 to 1:1 and setting the ratio of the gain coefficients β of the second reference current generating transistor Qr2 and the third reference current generating transistor Qr3 to 1:K, the inclination K of the output of the digital-to-analog conversion circuit section 25 may be set.

In the above embodiments, the present invention is applied to the organic electroluminescent display device 10 and satisfactory advantages are accomplished. However, the present invention may be applied to a non-linear digital-to-analog conversion circuit used for a voice compression device, in addition to the organic electroluminescent display device.

In the above embodiments, the present invention is applied to the digital-to-analog conversion circuit section 25 for converting the image digital data D (D1 to D4) of four bits into the analog current. However, the present invention may be applied to a digital-to-analog conversion circuit section 25 for converting the image digital data D of three or less bits or five or more bits into the analog current.

In the above embodiment, the first to fourth driving transistors Qd1 to Qd4 have different gain coefficients β.

Instead, by connecting a plurality of transistors having the same gain coefficient β in parallel and changing the number of transistors connected in parallel, the first to fourth driving transistors Qd1 to Qd4 may be allowed to equivalently have different gain coefficients β. As a result, according to the digital-to-analog conversion circuit section 25, it is possible to accurately obtain the analog current output having a linear characteristic with a small number of elements and a simple circuit structure.

In the above embodiment, the first to fourth driving transistors Qd1 to Qd4 have different gain coefficients β. Instead, by connecting a plurality of transistors having the same gain coefficient β in series and changing the number of transistors connected in series, the first to fourth driving transistors Qd1 to Qd4 may be allowed to equivalently have different gain coefficients β. As a result, according to the digital-to-analog conversion circuit section 25, it is possible to accurately obtain the analog current output having a linear characteristic with a small number of elements and a simple circuit structure.

In the above embodiments, the present invention is implemented in the pixel circuit 20 and satisfactory advantages are accomplished. However, the present invention may be implemented in a unit circuit for driving a current driven element like a light emitting element such as LED, FED or the like, in addition to the organic EL element OLED. Alternatively, the present invention may be implemented in a memory device such as RAM (specifically MRAM), etc.

In the above embodiments, although the present invention has been implemented in the organic EL element OLED as a current driven element, the present invention may be implemented in an inorganic electroluminescent element. That is, the present invention may be applied to an inorganic electroluminescent display device comprising inorganic electroluminescent elements.

In the above embodiments, although a case of employing the organic EL elements has been exemplified, the present invention is not limited thereto, but it may employ liquid crystal elements, digital micro mirror devices (DMD), field emission display devices (FED), surface-conduction electro-emitter display device (SED), and the like.

What is claimed is:

1. A current generating circuit comprising:

a current adding circuit for generating a plurality of elementary currents on the basis of a first control signal or a second control signal and then generating a resultant current by adding selected elementary currents from the plurality of elementary currents on the basis of digital input signals;

a first signal generating circuit for generating the first control signal;

a second signal generating circuit for generating the second control signal;

a first selection circuit for selecting either the first control signal or the second control signal and supplying the selected control signal to the current adding circuit; and a second selection circuit for supplying the resultant current of the current adding circuit to either the second signal generating circuit or an external circuit.

2. The current generating circuit according to claim 1, wherein the current generating circuit performs the selection on the basis of a selection signal from a selection control circuit for controlling the first and second selection circuits, wherein, when the first selection circuit selects the first control signal, the second selection circuit supplies from the current adding circuit to the second signal generating circuit the resultant current obtained by selecting and adding the elementary currents generated on the basis of the first control signal in accordance with the digital input signals, and stores the resultant current as the second control signal, and wherein, when the first selection circuit selects the second control signal, the second selection circuit supplies from the current adding circuit to the external circuit the resultant current obtained by selecting and adding the elementary currents generated on the basis of the second control signal in accordance with the digital input signals, as an output signal.

3. The current generating circuit according to claim 1, wherein the current values of the plurality of elementary currents generated from the current adding circuit have a binary-weighted relation.

4. The current generating circuit according to claim 1, wherein the current adding circuit is a digital-to-analog conversion circuit section, and wherein the digital-to-analog conversion circuit section comprises:

a plurality of first transistors having different gains, each first transistor comprising a first control terminal to which the first control signal or the second control signal is input through the first selection circuit, and generating the corresponding one of the plurality of elementary currents;

a plurality of second transistors connected in series to the plurality of first transistors, respectively, each second transistor comprising a second control terminal to which the corresponding digital input signals are input; and a current path for adding the elementary currents output from the corresponding first transistors on the basis of turn-on operation of the plurality of second transistors according to the digital input signals and supplying the added elementary currents as the resultant current to the second selection circuit.

5. The current generating circuit according to claim 1, wherein the gain coefficients of the plurality of first transistors are set to binary-weighted values, respectively.

6. The current generating circuit according to claim 1, wherein the first transistors include a parallel-connected structure of transistors having predetermined gains.

7. The current generating circuit according to claim 1, wherein the first transistors include a serial-connected structure of transistors having predetermined gains.

8. The current generating circuit according to claim 1, wherein the current adding circuit comprises an adjusting circuit for generating a second elementary current having a predetermined ratio with respect to the second control signal from the second signal generating circuit and adding the second elementary current to the resultant current, when the first selection circuit selects the second control signal.

9. The current generating circuit according to claim 1, wherein the second signal generating circuit comprises storage means for storing a signal corresponding to the resultant current generated by the current adding circuit as the second control signal.

10. The current generating circuit according to claim 1, wherein the second signal generating circuit comprises current-to-voltage conversion means for converting a current corresponding to the resultant current generated by the current adding circuit into a voltage.

11. The current generating circuit according to claim 10, wherein the second signal generating circuit has a function of storing the voltage generated by the current-to-voltage conversion means in the storage means.

12. An electronic apparatus comprising the current generating circuit according to claim 1.

13. An electro-optical device comprising a plurality of scanning lines, a plurality of data lines, and pixel portions having electro-optical elements provided corresponding to intersections of the plurality of scanning lines and the plurality of data lines, a scanning line driving circuit for scanning the plurality of scanning lines, and a data line driving circuit for supplying an analog current to the corresponding pixel portions through the plurality of data lines, wherein the data line driving circuit comprises:

a current adding circuit for generating a plurality of elementary currents on the basis of a first control signal or a second control signal and then generating a resultant current by adding selected elementary currents from the plurality of elementary currents on the basis of digital input signals;

a first signal generating circuit for generating the first control signal;

a second signal generating circuit for generating the second control signal;

a first selection circuit for selecting either the first control signal or the second control signal and supplying the selected control signal to the current adding circuit; and a second selection circuit for supplying the resultant current of the current adding circuit to either the second signal generating circuit or an external circuit.

14. The electro-optical device according to claim 13, wherein the data line driving circuit performs the selection on the basis of a selection signal from a selection control circuit for controlling the first and second selection circuits, wherein, when the first selection circuit selects the first control signal, the second selection circuit supplies from the current adding circuit to the second signal generating circuit the resultant current obtained by selecting and adding the elementary currents generated on the basis of the first control signal in accordance with the digital input signals, and stores the resultant current as the second control signal, and wherein, when the first selection circuit selects the second control signal, the second selection circuit supplies from the current adding circuit to the external circuit the resultant current obtained by selecting and adding the elementary currents generated on the basis of the second control signal in accordance with the digital input signals, as an output signal.

15. The electro-optical device according to claim 13, wherein the current values of the plurality of elementary currents generated from the current adding circuit have a binary-weighted relation.

16. The electro-optical device according to claim 13, wherein the current adding circuit is a digital-to-analog conversion circuit section, and wherein the digital-to-analog conversion circuit section comprises:

a plurality of first transistors having different gains, each first transistor comprising a first control terminal to which the first control signal or the second control signal is input through the first selection circuit, and generating the corresponding one of the plurality of elementary currents;

a plurality of second transistors connected in series to the plurality of first transistors, respectively, each second transistor comprising a second control terminal to which the corresponding digital input signals are input; and a current path for adding the elementary currents output from the corresponding first transistors on the basis of turn-on operation of the plurality of second transistors according to the digital input signals and supplying the added elementary currents as the resultant current to the second selection circuit.

17. The electro-optical device according to claim 13, wherein the gain coefficients of the plurality of first transistors are set to binary-weighted values, respectively.

18. The electro-optical device according to claim 13, wherein the first transistors include a parallel-connected structure of transistors having predetermined gains.

19. The electro-optical device according to claim 13, wherein the first transistors include a serial-connected structure of transistors having predetermined gains.

20. The electro-optical device according to claim 13, wherein, when the first selection circuit selects the second control signal, the current adding circuit comprises an adjusting circuit for generating a second elementary current having a predetermined ratio with respect to the second control signal from the second signal generating circuit and adding the second elementary current to the resultant current.

21. The electro-optical device according to claim 13, wherein the second signal generating circuit comprises storage means for storing a signal corresponding to the resultant current generated by the current adding circuit as the second control signal.

22. The electro-optical device according to claim 13, wherein the second signal generating circuit comprises current-to-voltage conversion means for converting a current corresponding to the resultant current generated by the current adding circuit into a voltage.

23. The electro-optical device according to claim 22, wherein the second signal generating circuit has a function of storing the voltage generated by the current-to-voltage conversion means in the storage means.

24. The electro-optical device according to claim 13, wherein the electro-optical elements are organic electroluminescent elements.

25. An electronic apparatus comprising the electro-optical device according claim 13.

* * * * *